US009722113B2

(12) United States Patent
Stoica et al.

(10) Patent No.: US 9,722,113 B2
(45) Date of Patent: Aug. 1, 2017

(54) TETRADYMITE LAYER ASSISTED HETEROEPITAXIAL GROWTH AND APPLICATIONS

(71) Applicant: The Regents of the University of Michigan, Ann Arbor, MI (US)

(72) Inventors: Vladimir A. Stoica, Ann Arbor, MI (US); Lynn Endicott, Ann Arbor, MI (US); Roy Clarke, Ann Arbor, MI (US); Ctirad Uher, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 14/807,378

(22) Filed: Jul. 23, 2015

(65) Prior Publication Data

US 2016/0027938 A1 Jan. 28, 2016

Related U.S. Application Data

(60) Provisional application No. 62/028,165, filed on Jul. 23, 2014.

(51) Int. Cl.
| | |
|---|---|
| *H01L 31/032* | (2006.01) |
| *H01L 31/18* | (2006.01) |
| *H01L 33/00* | (2010.01) |
| *H01L 33/12* | (2010.01) |
| *H01L 31/0352* | (2006.01) |

(Continued)

(52) U.S. Cl.
CPC ........ *H01L 31/0322* (2013.01); *H01L 31/032* (2013.01); *H01L 31/0326* (2013.01); *H01L 31/035272* (2013.01); *H01L 31/0725* (2013.01); *H01L 31/18* (2013.01); *H01L 31/1864* (2013.01); *H01L 33/005* (2013.01); *H01L 33/12* (2013.01); *H01L 33/26* (2013.01); *H01L 22/12* (2013.01)

(58) Field of Classification Search
None
See application file for complete search history.

(56) References Cited

U.S. PATENT DOCUMENTS 4,004,063 A * 1/1977 Peterson ................ H01B 3/306
427/388.1
5,039,626 A 8/1991 Koma et al.
(Continued)

OTHER PUBLICATIONS

Song, Can-Li et al.,, entitled, Topological Insulator Bi2Se3 Thin Films Grown on Double-Layer Graphene by Molecular Beam Epitaxy, by Applied Physics Letters, vol. 97, Issue 14, Oct. 2010, p. 143118.*

(Continued)

*Primary Examiner* — Erik Kielin
(74) *Attorney, Agent, or Firm* — Harness, Dickey & Pierce, P.L.C.

(57) ABSTRACT

A multilayer stack including a substrate, an active layer, and a tetradymite buffer layer positioned between the substrate and the active layer is disclosed. A method for fabricating a multilayer stack including a substrate, a tetradymite buffer layer and an active layer is also disclosed. Use of such stacks may be in photovoltaics, solar cells, light emitting diodes, and night vision arrays, among other applications.

44 Claims, 9 Drawing Sheets

(51) Int. Cl.
*H01L 33/26* (2010.01)
*H01L 31/0725* (2012.01)
*H01L 21/66* (2006.01)

(56) References Cited

U.S. PATENT DOCUMENTS

| | | | |
|---|---|---|---|
| 7,858,872 | B2 | 12/2010 | Hotz et al. |
| 8,298,856 | B2 * | 10/2012 | Garnett ............. H01L 31/02966 |
| | | | 257/13 |
| 8,415,761 | B2 | 4/2013 | Mantese |
| 9,024,415 | B2 | 5/2015 | Zhang et al. |
| 2003/0099279 | A1 * | 5/2003 | Venkatasubramanian B82Y 10/00 |
| | | | 374/179 |
| 2010/0284218 | A1 * | 11/2010 | Aizawa .............. G11C 13/0004 |
| | | | 365/174 |
| 2012/0098024 | A1 * | 4/2012 | Hsu ........................ H01L 33/38 |
| | | | 257/99 |
| 2015/0107640 | A1 * | 4/2015 | Caylor .................... H01L 35/16 |
| | | | 136/238 |
| 2015/0207011 | A1 * | 7/2015 | Garnett .............. H01L 31/0368 |
| | | | 136/255 |

OTHER PUBLICATIONS

Hu et al., "Band diagrams and performance of CdTe solar cells with a Sb2Te3 back contact buffer layer", AIP Advances Journal, vol. 1, Issue 042152 (2011).
Tarakina et al., "Comparative Study of the Microstructure of Bi2Se3 Thin Films Grown on Si(111) and InP(111) Substrates", Crystal Growth and Design Journal, vol. 12, Issue 4 (2012).

* cited by examiner

TETRADYMITE LAYER ASSISTED HETEROEPITAXIAL GROWTH AND APPLICATIONS

CROSS-REFERENCE TO RELATED APPLICATIONS

This application claims the benefit of U.S. Provisional Application No. 62/028,165, filed on Jul. 23, 2014. The disclosure the above provisional application is incorporated herein by reference.

GOVERNMENT SUPPORT

This invention was made with government support under DE-SC0000957 awarded by the Department of Energy. The Government has certain rights in the invention.

BACKGROUND

This section provides background information related to the present disclosure which is not necessarily prior art.

The quality of semiconducting films deposited on various substrates is strongly dependent on the bonding and structural compatibility at the film-substrate interface. Differences in the crystalline symmetries or atomic periodicities between films being synthesized and supporting substrates generate strain and defects, resulting in poor quality of film growth. Some of these obstacles can be overcome by advantageously choosing substrate materials with certain atomic periodicities on their surface that can allow obtaining interfacial synergy between the films being synthesized and the substrate material, i.e., matching integer multiples of the interatomic spacing of the substrate with integer multiples of the film being grown on it. The most common approach for obtaining high-performance optoelectronic properties is based on film fabrication on lattice-matched, single-crystal substrates, which tend to be expensive, but can assure epitaxial growth with low defect densities. This is cost prohibitive for large area applications such as photovoltaic (PV) panels and light-emitting devices (LED) due to large substrate sizes and expenses. An alternate approach, which is applicable to a wide variety of substrate materials, crystalline and non-crystalline, including glass and plastics, is desired.

The absence of structural ordering at the interface of a thin film with amorphous substrate, promotes the growth of disordered or polycrystalline films. There is no known way to match a high-quality crystalline film to a substrate that has no underlying order. One way around this problem is the use of highly-textured metallic layers, such as Mo or Ti layers, on glass; this has been shown to improve optoelectronic material fabrication in PV cells and LED's, respectively. However, introducing highly-textured metallic layers on glass substrates results in more expensive and time intensive fabrication. A more cost effective and efficient fabrication process to form ordered high quality crystalline films would be desirable.

SUMMARY

This section provides a general summary of the disclosure, and is not a comprehensive disclosure of its full scope or all of its features.

The present technology provides for a multilayer stack. The multilayer stack has a substrate, a layer of an active material, e.g., having optoelectronic functionalities in any embodiment of devices in which the multilayer stack may be used, and a buffer layer positioned between the substrate and the layer of the active material. The substrate can be composed of an amorphous, single-crystalline, or polycrystalline material. The buffer layer is composed of a tetradymite compound, such as $Bi_2Te_3$, $Sb_2Te_3$, Bi2Se3, Bi2Te2Se, $Bi_2Te_2S$, $Bi_2Se_2S$, $Sb_2Te_2Se$, $Sb_2Te_2S$, $Bi_2Se_2Te$, $Bi_2Te_{1.5}S_{1.5}$, or $Bi_2Te_{1.6}S_{1.4}$. In various embodiments, the active material is a semiconducting compound, such as an IUPAC Group II-VI alloy, a IV-VI alloy, a hybrid Si-II-VI alloy, a hybrid Ge-II-VI alloy, a hybrid Sn-II-VI alloy, a hybrid Pb-II-VI alloy or a III-V alloy. In certain aspects, the tetradymite buffer layer can be tuned to allow for a better match between the lattice interatomic spacing of the buffer layer and the lattice interatomic spacing of the layer of the active material. Thus, the present technology provides a technique for growing an ordered crystalline or polycrystalline multilayer stack on disordered, amorphous, or non-crystalline substrates.

The present technology also provides for a method for fabricating a multilayer stack. The method optionally includes depositing a tetradymite buffer layer onto a substrate, and depositing a layer of an active material on the buffer layer. The method may optionally include obtaining the substrate prior to deposition. Depositing the tetradymite buffer layer and depositing the layer of an active material can be performed by vapor phase growth, chemical vapor deposition, liquid phase epitaxy, vapor jet printing, organic vapor deposition, molecular beam epitaxy (MBE), plasma discharge coating, sputtering, electron beam evaporation, metallorganic chemical vapor deposition (MOCVD), vacuum evaporation, spray coating, spray coating with post deposition annealing, electrodeposition, close space sublimation, vapor jet printing, or atomic layer deposition. In some embodiments, the method includes validating the quality of the multilayer stack by x-ray scattering, electron scattering, atomic force microscopy, and by optical measurements.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figures 6A, 6B:
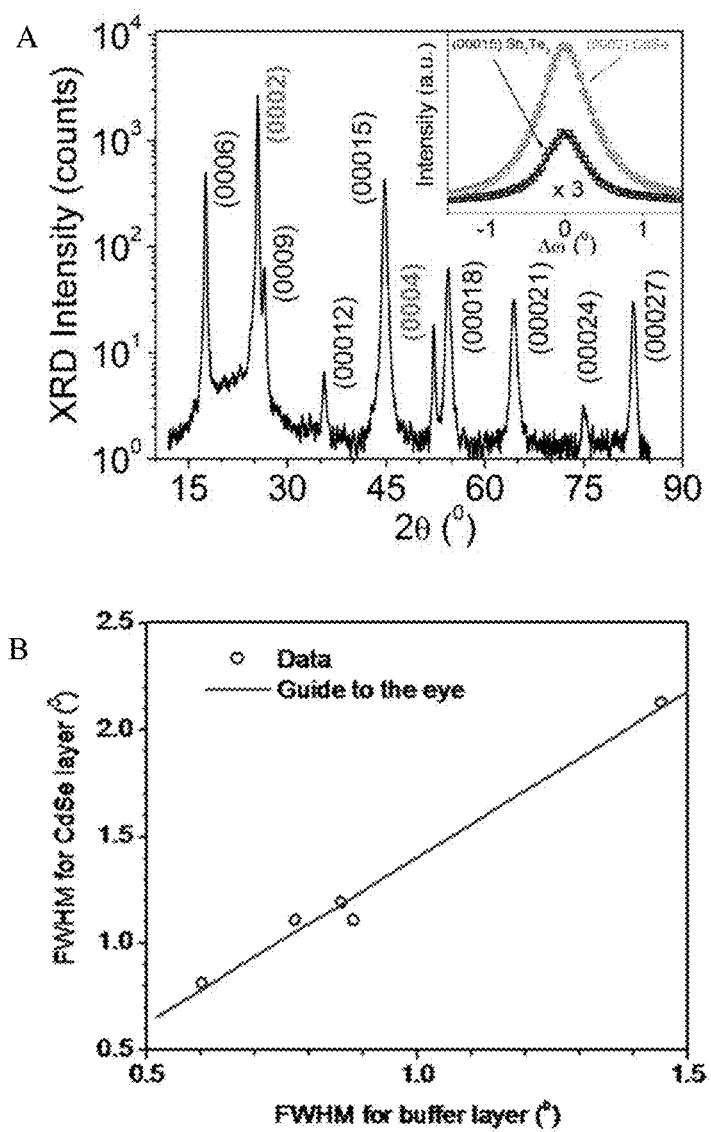
Figures 7A, 7B:
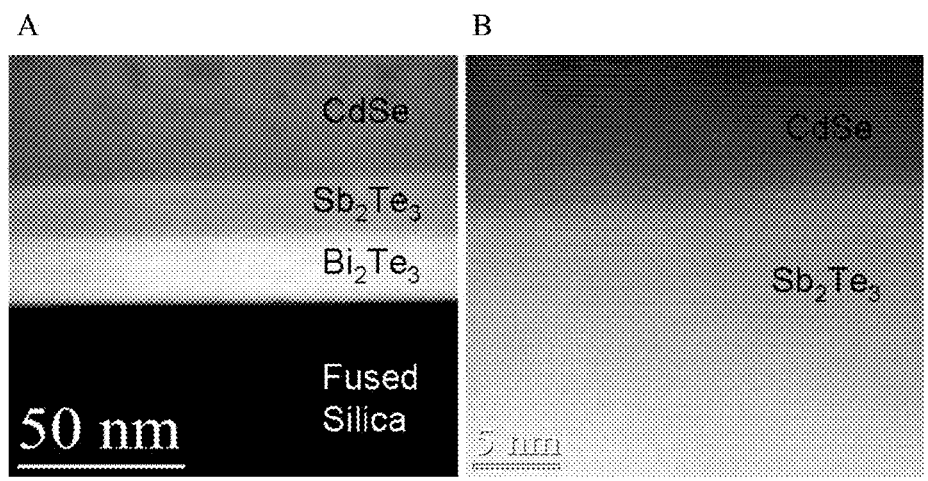
Figures 8A, 8B:
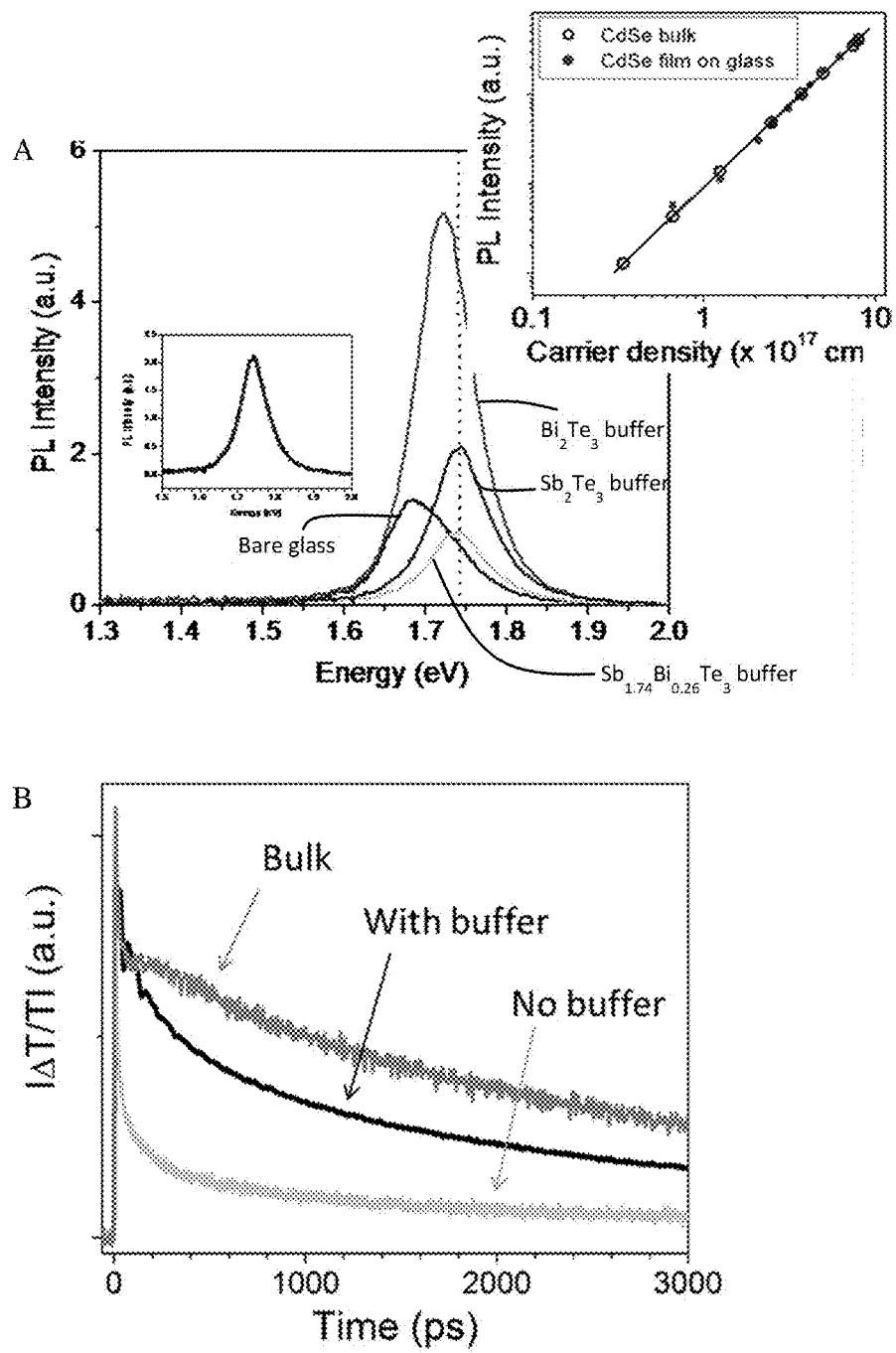
Figure 8C:
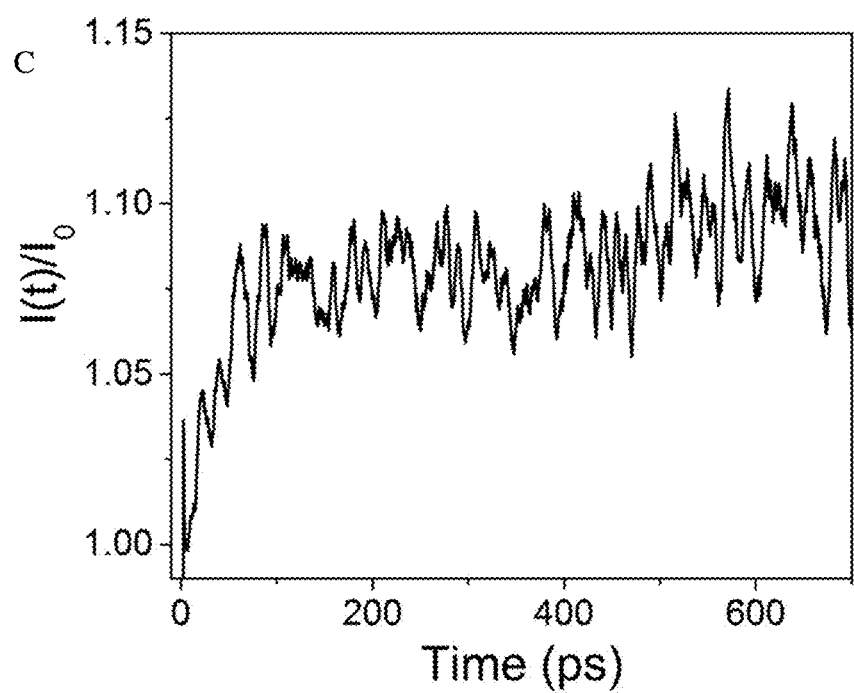
Figure 9:
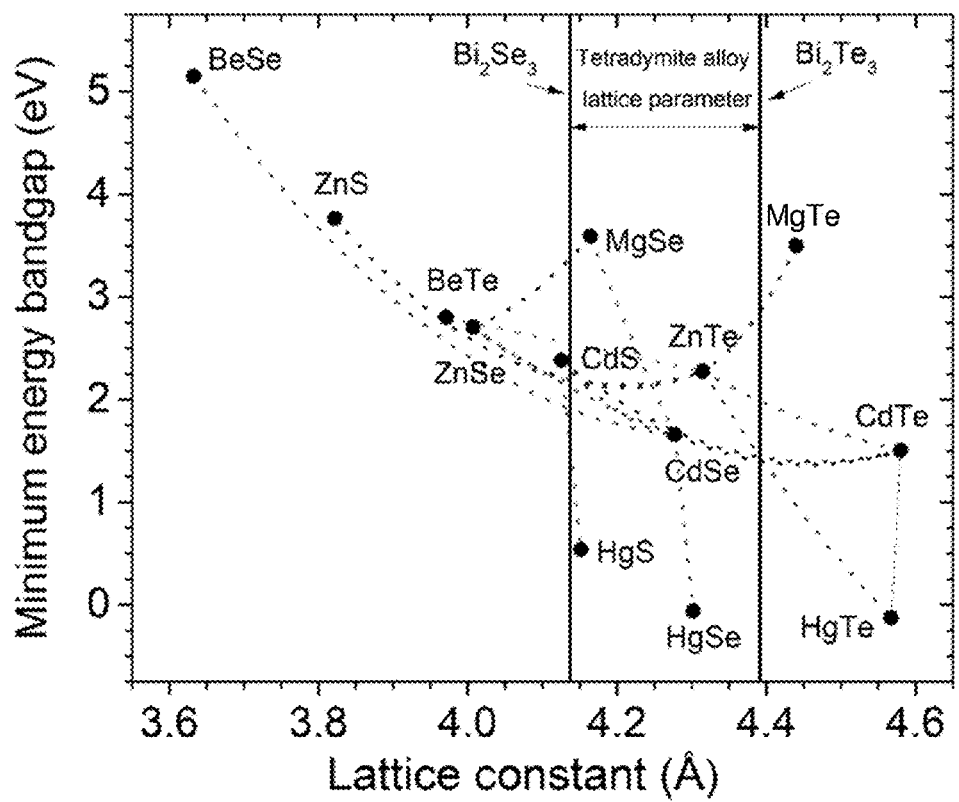

FIGS. 6A-6B. FIG. 6A shows results of x-ray diffraction measurements performed on CdSe layers, including rocking curve scans in the inset, and FIG. 6B shows a plot of full-width-at-half-maximum (FWHM) of the CdSe layer versus FWHM for the buffer layer;

FIGS. 7A-7B. FIG. 7A shows a cross-sectional transition electron microscopy (TEM) image of a multilayer structure, and FIG. 7B shows a TEM image of a CdSe—$Sb_2Te_3$ interface;

FIGS. 8A-8C. FIG. 8A shows a graph of photoluminescence (PL) measurements of CdSe samples grown on substrates with and without a buffer layer, including measurements of integrated PL intensity as a function of pumping power at 519 nm in the inset, and FIG. 8B shows a graph showing the charge-carrier lifetimes of CdSe layers grown on substrates with and without a buffer layer, and FIG. 8C shows a graph showing a ratio between optical transient transmission intensities acquired with near-overlapping and fully-overlapping laser spot beams for a CdSe single crystal used for monitoring carrier diffusivity of the sample; and FIG. 9 shows a graph of band gap versus lattice parameter for various chalcogenide semiconductors, including binary compounds as dots and their ternary alloys as connecting dotted lines between their binary counterparts, wherein the lattice parameters shown represent the c-plane axis parameter for compounds with crystalline structures that can be indexed in the hexagonal lattice system and the (110) interplanar lattice spacing parameter for compounds with crystalline structures that can be indexed in cubic lattice system, and the c-plane lattice parameters of binary tetradymite compounds are shown as vertical lines, where the corresponding ternary tetradymite compounds have lattice parameters that can be continuously adjusted in between the values indicated that correspond to the binary tetradymite compounds.

Corresponding reference numerals indicate corresponding parts throughout the several views of the drawings.

DETAILED DESCRIPTION

Example embodiments will now be described more fully with reference to the accompanying drawings.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters.

As referred to herein, ranges are, unless specified otherwise, inclusive of endpoints and include disclosure of all distinct values and further divided ranges within the entire range. Thus, for example, a range of "from A to B" or "from about A to about B" is inclusive of A and of B. Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The absence of structural ordering at the interface of a thin film with amorphous substrate, promotes the growth of disordered or polycrystalline films. In one approach, a so-called van der Waals (vdW) epitaxy of layered compounds is employed. This approach establishes preferential anisotropic bonding parallel to the substrate surface to relieve the large structural mismatch, while accommodating the transition from amorphous substrate to crystalline film. Particularly favorable for vdW growth are structures that naturally incorporate a vdW gap, such as a tetradymite family of compounds (e.g., $Bi_2Te_3$, $Sb_2Te_3$ and $Bi_2Se_3$). Experience with growing such tetradymite-based layered structures has seen a steady increase in the last few years. However, their potential use as buffer layers for optoelectronic materials remains unexplored. Accordingly, there remains a need to develop multilayer stacks with inexpensive amorphous substrates and methods of fabricating multilayer stacks including inexpensive amorphous substrates.

The current technology provides for high quality heteroepitaxial growth on essentially any substrate, including glass and silicon (Si). Moreover, the current technology relates to the fabrication of solid state heterostructures that include at least one layer with a tetradymite-type crystalline structure and their use in optoelectronic devices and in arrays of optoelectronic devices, including photovoltaic cells and detectors, as well as light or electromagnetic wave emitting devices. As used herein, a "heterostructure" is a structure having layers of materials with differing bandgaps, and includes crystalline, non-crystalline, or crystalline and non-crystalline layers, simultaneously. In one embodiment of the present technology, a solid state heterostructure is fabricated and includes at least one layer with a tetradymite-type crystalline structure that is connected through a van der Waals-like interface with a semiconducting or insulating layer with a similar or dissimilar crystalline structure as the tetradymite-type crystalline structure. As used herein, the term "tetradymite-type crystalline structure" refers to a trigonal anisotropic crystal structure that can also be indexed in rhombohedral or hexagonal crystal lattice systems that are similar to that of tetradymite. As used herein, "tetradymite" refers to compounds pertaining to mineral tetradymite comprising at least bismuth, antimony, or combinations thereof, and at least one group VI element, such as tellurium, selenium, sulfur, or combinations thereof. Therefore, various tetradymite compounds are IUPAC Group Nos. V-VI compounds. The ensuing discussion of molecules and compounds designated with roman numerals refers to the IUPAC group number, unless otherwise indicated. The tetradymite compounds are grown with a determined crystalline orientation with respect to a substrate's surface, where the unique crystal c-axis of the tetradymite compound is oriented close to perpendicular to the substrate's surface and the tetradymite c-plane crystallographic plane is close to parallel to the substrate's surface, which takes advantage of the bonding anisotropy of tetradymite compounds. The c-plane of tetradymite compounds provides an interatomic spacing along the crystallographic plane, which can be adjusted, tuned or matched via alloying different tetradymite compounds within a useful range of lattice parameters in the 4-4.5 Å interval. Non-limiting examples of tetradymite compounds include binary semiconductors, such as $Bi_2Te_3$, $Sb_2Te_3$, or $Bi_2Se_3$; ternary semiconductors, such as $Bi_{2-x}Sb_xTe_3$; and quaternary semiconductors with tetradymite structure, such as $(Bi_{1-x}Sb_x)_2(Te_{1-y}Se_y)_3$, $(Bi_{1-x}Sb_x)_2(S_{1-y}Se_y)_3$, $(Bi_{1-x}Sb_x)_2(Te_{1-y}S_y)_3$, or alloys thereof, where x and y are 0, 1 or a value between 0 and 1. Non-limiting examples of ternary tetradymite compounds include $Bi_2Te_2Se$, $Bi_2Te_2S$, $Bi_2Se_2S$, $Sb_2Te_2Se$, $Sb_2Te_2S$, $Bi_2Se_2Te$, $Bi_2Te_{1.5}S_{1.5}$, and $Bi_2Te_{1.6}S_{1.4}$. The tetradymite layers provide a means for promoting heteroepitaxial growth of high quality films of active optoelectronic materials.

In some embodiments, the tetradymite compound composition is stoichiometric and chosen in such a way that the ratio between the total number of atoms from group V and group VI elements within the tetradymite compound is 2:3 or about 2:3. In other embodiments, the ratio between the total number of atoms from group V and group VI elements within the tetradymite compound can be varied from about 3:7 to about 1:2 while preserving the structural integrity of the tetradymite crystalline structure.

The active optoelectronic materials include, but are not limited to, compound semiconductors with zinc-blend, wurtzite, rock salt, diamond, and tetragonal structures. Non-limiting examples of active optoelectronic materials include chalcogenide semiconductor compounds or III-V semiconductor compounds, both of the $A_xB_{1-x}C_yD_{1-y}$ type, where x and y are 0, 1 or values between 0 and 1. In the case of chalcogenide semiconductors of $A_xB_{1-x}C_yD_{1-y}$ type, the elements A and B are individually selected from the group consisting of Cd, Zn, Hg, Mg, Be, Pb, Sn, Ge, and Si, and the elements C and D are individually selected from the group consisting of Te, Se, and S. In the case of III-V semiconductors of $A_xB_{1-x}C_yD_{1-y}$ type, the elements A and B are individually selected from the group consisting of B, Al, Ga, and In, and the elements C and D are individually selected from the group consisting of N, P, As, and Sb. The active optoelectronic materials can also simply be binary compound semiconductors. Examples of binary compound semiconductors serving as active optoelectronic materials include, but are not limited to, CdSe, CdS, CdTe, ZnTe, ZnS, ZnSe, MgSe, MgTe, MgS, HgTe, HgSe, HgS, BeTe, BeSe, PbSe, PbTe, PbS, GaN, GaAs, GaSb, GaP, InP, InSb, InN, InAs, AlSb, AlAs, AlP, AlN, and BN. Other non-limiting active optoelectronic materials include semiconductor compounds $Cu_2ZnSnSe_4$, $Cu_2ZnSnS_4$, $CuInSe_2$, $CuInS_2$, $ZnSnN_2$ and $CuIn_xGa_{1-x}Se_2$, wherein x is less than or equal to 1. In various embodiments, the active layer material, or the plurality of active layer materials, has a crystalline structure that is different than the tetradymite crystalline structure. Therefore, the tetradymite buffer layer can be tuned to match the interatomic spacing of the active layer. In other embodiments a plurality of active layer materials can be interspaced by tetradymite layers or a plurality of tetradymite layers with active or passive, optoelectronic functionalities. In another embodiment, the active layer, or plurality of active layers, is grown on the surface of the top tetradymite buffer layer, wherein the atomic planes of the active material have, but are not limited to, 3-fold, 6-fold or 12-fold symmetry, and are also parallel to the atomic plane within the surface of the top tetradymite buffer layer.

The current technology is useful in fabricating device structures where multiple layers of semiconductor are required, maintaining structural coherence and low defect concentrations. These benefits are achieved by the extreme anisotropy in bonding in the tetradymite layer, in certain aspects, extreme anisotropy, which mediates the lattice mismatch between the different layers of the heterostructure. In optoelectronic device embodiments, electromagnetic waves or light are absorbed and used to induce a non-equilibrium charge carrier population in at least one semiconducting layer with the tetradymite-type crystalline structure; a non-equilibrium carrier population that is further injected in the adjacent layers with larger bandgaps at a rate that is faster than the characteristic relaxation rate of the non-equilibrium charge carrier population inside the semiconducting layer with the tetradymite-type structure. In particular, in a photovoltaic cell device according to the current technology, electron charge carriers and hole charge carriers are separated spatially for further charge collection at the device contacts placed below and above the solid state heterostructure. In particular, in light emitting or absorbing device embodiments of the present invention, substantial electron charge carrier and hole charge carrier populations are injected simultaneously from at least one of the tetradymite-type layers into another adjacent tetradymite-type layer or non-tetradymite-type layer to obtain light or electromagnetic wave emission or photovoltaic conversion with large efficiency from the solid state heterostructure integrated inside the light emitting or light capturing device. The tetradymite can be used as a thin or ultrathin buffer layer for a high performance heterostructure device, or as one component of a multilayered device structure as a means to maintain coherent (defect free) structure throughout the device.

By combining thin or ultrathin layers of tetradymite-type semiconductors having low band gap with larger band gap semiconductor barriers, it is possible to separate and extract photo-generated charge carriers in large-efficiency photovoltaic devices, where charge carriers are injected from highly absorbing tetradymite-type semiconductors into less absorbing bandgap semiconductors of the same type, different semiconductors, or insulators, with either small or substantially large mismatch of the lattice parameter or crystalline structure. An important aspect of the present technology is the ability to provide epitaxial demonstration of a plurality of layered heterostructures joined through weak van der Waals bonding.

There is a vast array of applications for the heterostructures of the present technology. Non-limiting applications include large scale solar panel technology, buffer layers for LED structures, photodetectors for infrared night vision and research, thermoelectric device construction, novel hybrid (TE/PV) devices that capture and recycle waste heat in PV cells, and improving bulk Si solar cells by adding a tetradymite layer to capture the part of the spectrum not absorbed by silicon (infrared region). Moreover, tetradymite alloys are highly conductive and can be semitransparent to light up to several nanometers while also allowing for a substantially undiminished carrier injection through them when placed at the interface between multiple junctions in a solar cell stack. In this application, a few nanometers of a tetradymite alloy are placed in the tunnel junction region of a multijunction solar cell stack to decrease series resistance and improve efficiency. Additionally, if the tetradymite alloy layer composition is tuned to lattice match the lattice constant of the junction grown directly on top of the tetradymite layer, then suppression of defects related to lattice mismatch will occur and the multijunction solar cells or the solar cell panels will have a higher efficiency.

Currently, most solar cell panels on the market are dominated by Si, CdTe and CIGS (copper, indium, gallium, selenide) materials and the technology is relatively mature. However, the efficiency of Si, CdTe and CIGS single junction solar cells is limited to below about 30%. Prospects for tandem or multiple junction devices with high efficiency using a combination of Si, CdTe or CIGS are very difficult to realize due to the very large lattice mismatch between these materials. In contrast, lattice matched III-V semiconductor alloys are used to obtain multijunction devices with efficiencies of about 45%, but their cost is too high to become practical.

The present technology provides for growth of an epitaxial tetradymite ultrathin layer on top of, for example, Si or CdTe with <111> out-of-plane texture (among many other substrates) to promote the epitaxy of semiconductor junctions with larger bandgap in either a tandem or multijunction device. For example, because of its bandgap of 1.7 eV, CdSe may be a very good top junction material for a high efficiency tandem device using a bottom Si semiconductor junction. Additionally, a CdSe or a II-VI related compound alloy of the $A_xB_{1-x}C_yD_{1-y}$ type can be used in a semiconductor junction that is joined epitaxially with a Si semiconductor junction via a tetradymite layer, wherein x and y are 0, 1 or values between 0 and 1, the elements A and B are individually selected from the group consisting of Cd, Zn, Hg, Mg, Be, Pb, Sn, Ge, and Si, and the elements C and D are individually selected from the group consisting of Te, Se and S. A resulting tandem cell efficiency of at least about 37% is expected, because of the optimal bandgap choice for the top junction for tandem cells based on Si is at 1.7 eV. Moreover, the c-plane tetradymite layer lattice constant can be tuned in the interval of from 4 Å to about 4.5 Å to lattice match active layers or a plurality of active layers comprising, for example, chalcogenide semiconductors, III-V semiconductors, or a combination thereof. A hybrid of Si, Ge, Sn, Pb, or C with semiconductors such as: CdSe, CdS, CdTe, ZnTe, ZnS, ZnSe, MgSe, MgTe, MgS. HgTe, HgSe, HgS, BeTe, BeSe, GaN, GaAs, InP, InSb, GaSb, AlSb, AlAs, AlP, PbSe, PbTe or semiconductors of the $A_xB_{1-x}C_yD_{1-y}$ type, where x and y are 0, 1 or values between 0 and 1, the elements A and B are individually selected from the group consisting of Cd, Zn, Hg, Mg, Be, and the elements C and D are individually selected from the group consisting of Te, Se and S with efficiency close to 37% is comparable with state of the art tandem cell devices, but may come at a much smaller cost when simply using an ultrathin tetradymite layer for inducing the epitaxial growth of semiconductor heterostructures. Similarly, top semiconductor junctions using III-V semiconductors can also be used, while growing on CdTe, CIGS or GaAs using tetradymite layer epitaxy of heterostructures.

The use of tetradymite-type semiconductors in photovoltaic and light emission optoelectronic devices and arrays is beneficial due to several distinct advantages over conventionally bonded semiconductors (covalent or ionic). For example: (a) the van der Waals bonding of the heterostructure layers inhibits interface and bulk related defect formation, which can minimize charge carrier trapping; (b) a resulting large propagation depth of photo-generated charge carrier populations is larger relative to the light absorption extinction depths, which makes the carrier extraction very efficient; (c) the light absorption depths, which are on the order of 10-50 nm across the solar spectrum, relieve the need for large material consumption; (d) the recombination of charge carriers at the interface of the tetradymite-type semiconductors can be smaller than in the bulk due to their exotic band structure effects, which can improve the charge injection efficiency; this effect is absent in traditional semiconductors used in photovoltaic devices such as Si, Ge, GaAs, CdTe, etc.; and (e) it provides for inexpensive preparation of optoelectronic materials and devices on a wide range of substrates.

Figure 1:
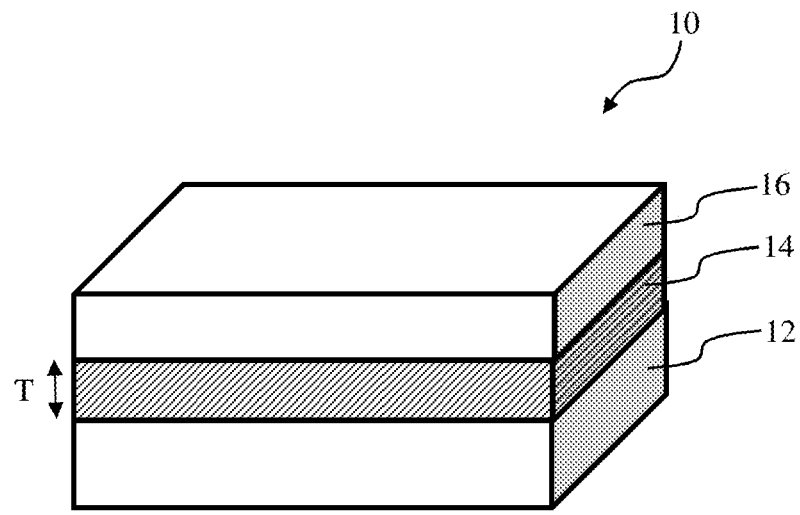
FIG. 1 shows a perspective view of a first multilayer stack according to certain aspects of the present disclosure.
Figure 2:
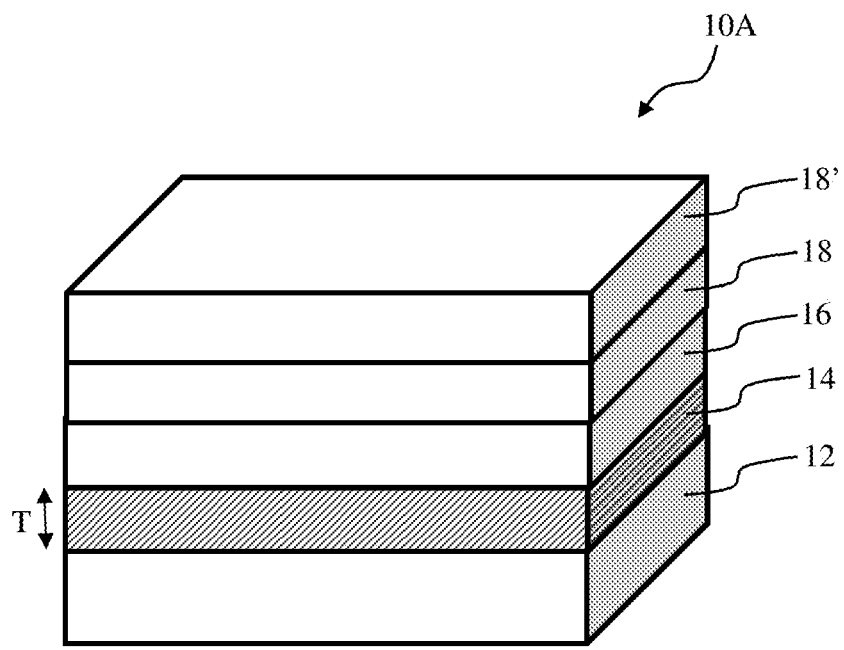
FIG. 2 shows a perspective view of a second multilayer stack according to certain aspects of the present disclosure.

With reference to FIG. 1, the present technology provides for a multilayer stack 10 comprising a substrate 12, a first layer of an active material 16 (also referred to herein as an "active layer"), and a buffer layer 14 positioned between the substrate 12 and the first layer of the active material 16. As used herein, a multilayer stack can also be referred to as a coating stack. The buffer layer 14 can be in contact with non-crystalline, i.e., amorphous, substrates or crystalline substrates composed of crystalline materials. The crystalline substrates can be single-crystalline substrates composed of a single-crystalline solid material or polycrystalline substrates composed of a polycrystalline solid material. FIG. 2 shows a second multilayer stack 10A, which comprises the same substrate 12, buffer layer 14, and active material 16 components as the multilayer stack 10 of FIG. 1. However, the multilayer stack 10A of FIG. 2 includes additional active layers 18, 18'. Therefore, the multilayer stack comprises a plurality of active layers in various embodiments.

As used herein, a "single-crystalline material" is characterized with long-range order throughout the material, wherein "long-range order" refers to the periodicity of the atom arrangement in a material. In contrast, in a "polycrystalline material," long-range order exists only within limited grains. For example, in a polycrystalline material, grains are randomly connected and the size of the grains varies in x-y-z directions depending on the material and how the material was formed. In a polycrystalline material, there is no preferential extension of a single-crystal within the grain in any direction. Non-crystalline or amorphous materials lack long-range order altogether. In various embodiments, the substrate 12 is composed of organic or inorganic non-crystalline materials or organic or inorganic crystalline materials. The substrate 12 can be inflexible, i.e., rigid, or flexible. Moreover, the substrate 12 can be composed of an insulating material, a non-conducting material, a semi-conducting material, or a conducting (metallic) material. The substrate 12 can be any shape or size. For example, the substrate 12 can be planar; cylindrical; such as in the configuration of a wire; spherical; etc. The substrate 12 can have a surface size ranging from square millimeters to square meters.

The substrate 12 can be composed of crystalline materials or non-crystalline materials. Non-limiting examples of non-crystalline and crystalline materials include plastics, polymers, oligomers, and metals. In various embodiments, the crystalline material is silicon, silica (silicon dioxide or silicon oxide), aluminum oxide, sapphire, germanium, $Al_2O_3$, $MgAl_2O_4$, GaP, Ge, InAs MgO, GaAs, silicon carbide, gallium phosphide, gallium nitride, indium phosphide, zinc oxide, aluminum nitride, bismuth germanate, or oxides, nitrides, metals or alloys thereof. Non-limiting examples of non-crystalline (amorphous) materials include glass, plastics, polyimide, polymers, metals, oligomers, and mixtures thereof. Non-limiting examples of glass include fused silica glass, sodium borosilicate glass, aluminosilicate glass, vitreous silica glass, soda-lime-silica glass, window glass, PYREX® borosilicate glass marketed by Corning Inc. (Tewksbury, Mass.), lead-oxide glass, oxide glass, crystal glass, and quartz. In one embodiment, the non-crystalline material is KAPTON® polyimide film developed by DuPont (Wilmington, Del.).

In some embodiments, the buffer layer 14 coats, and is in direct contact with, the substrate 12. In other embodiments, the substrate 12 is pre-coated with an inorganic material, an organic material, a carbon-based material, or a conducting optically transparent oxide. Non-limiting examples of organic materials include pentacene, anthracene, rubrene, polyacetylene, polypyrrole, polyaniline, and copolymers thereof. Non-limiting examples of carbon-based materials include graphite, graphene, graphane, graphene oxide, and graphite oxide. Non-limiting examples of conducting optically transparent oxides include doped and undoped inorganic compounds such ZnO, $In_2O_3$, $SnO_2$, $Cr_2O_3$, $CuCrO_2$, $CuCr_{0.5}Al_{0.5}O_2$, $Mg_{1-x}Zn_xO$, $Ga_2O_3$, CdO, $CuGaO_2$ and their alloys thereof, wherein x is equal to or less than 1. Other transparent materials include graphene, graphane, graphene oxide or organic compounds such as poly(3,4-ethylenedioxythiophene), poly(4,4-dioctylcyclopentadithio-phene). Non-limiting examples of dopants include electron donating or accepting elements from group I to group VII, transition metals, rare earth elements, organo-metallic complexes containing transition metals, and combinations and compounds thereof.

Various heterostructures and homostructures used in the art are inefficient, in part because many semiconductors do not coat many substrates well. Inefficiencies and defects arise because the lattice structure of the substrate does not match the lattice structure of the semiconductor at the substrate-semiconductor interface. This lattice mismatch results in pits, grooves, alleys, and other topological malformations in the semiconductors, which adversely impacts efficiency. Therefore, the present technology provides for a buffer layer 14 positioned between an active layer 16 and the substrate 12. By positioning the buffer layer 14 on the substrate 12, a template is developed that allows for a better match between the lattice structure of the buffer layer 14 and the lattice structure of the first active layer 16. A match between the lattice structure of the buffer layer 14 and the lattice structure of the first active layer 16 means that the periodic spacing of the atoms of the buffer layer 14 matches the spacing of the atoms of the active layer 16 at a buffer layer and active layer interface. Accordingly, the buffer layer 14 comprises grains of a buffer material, wherein at least about 75% of the grains are directionally aligned along at least one crystallographic axis. In other embodiments, at least about 80%, at least about 85%, at least about 90%, at least about 95%, or at least about 99% of the grains of the buffer material are directionally aligned with respect to at least one crystallographic axis. In one embodiment, about 90% of the grains of the buffer material are directionally aligned along at least one crystallographic axis.

The buffer layer 14 can have a thickness T of from about 0.2 nm to about 100 µm. In some embodiments, the buffer layer 14 has a thickness T of from about 1 nm to about 1 µm. The buffer layer 14 can be an active or inactive component of the multilayer. Although not shown in the figures, in some embodiments, the multilayer stack comprises a substrate and an active buffer layer. In one embodiment, the multilayer stack consists of a substrate and an active buffer layer.

The buffer material comprises a tetradymite compound. Accordingly, the buffer layer 14 is also referred to as a tetradymite buffer layer 14. In various embodiments, the tetradymite compound is a binary semiconductor; such as $Bi_2Te_3$, $Sb_2Te_3$, $Bi_2Se_3$, or solid solutions thereof; a ternary semiconductor, such as $Bi_{2-x}Sb_xTe_3$, wherein x is 0, 1, or a value between 0 and 1; or a quaternary semiconductor, such as $(Bi_{1-x}Sb_x)_2(Te_{1-y}Se_y)_3$, $(Bi_{1-x}Sb_x)_2(S_{1-y}Se_y)_3$ or $(Bi_{1-x}Sb_x)_2(Te_{1-y}S_y)_3$ or alloys thereof that preserve the tetradymite structure, where x and y are 0, 1 or a value between 0 and 1. In other embodiments, the tetradymite compound is a ternary tetradymite compound, such as $Bi_2Te_2Se$, $Bi_2Te_2S$, $Bi_2Se_2S$, $Sb_2Te_2Se$, $Sb_2Te_2S$, $Bi_2Se_2Te$, $Bi_2Te_{1.5}S_{1.5}$, $Bi_2Te_{1.6}S_{1.4}$, or alloys thereof. The tetradymite compounds are preferably grown with a certain crystalline orientation with respect to the substrate 12 surface, wherein their unique crystal c-axis is oriented close to perpendicular to the substrate 12 surface and their c-plane crystallographic plane is close to parallel to the substrate surface, which takes advantage of the bonding anisotropy of tetradymite compounds. The c-plane of tetradymite compounds provides an interatomic spacing along the crystallographic plane, which can be adjusted via alloying different tetradymite compounds within a useful range of lattice parameters in the 4-4.5 Å interval.

The first active layer 16 has a first lattice structure with a first lattice spacing, and the buffer layer 14 has a second lattice structure with a second lattice spacing. Typically, the second lattice spacing is different from the first lattice spacing. Therefore, in order to provide a sufficient lattice match at the interface between the buffer layer 14 and the first active layer 16, the lattice structure of the tetradymite buffer layer 14 can be varied, matched or tuned with respect to the first lattice spacing of the first lattice structure. In other words, the tetradymite buffer layer 14 can be tuned to match the interatomic periodic spacing of the tetradymite lattice structure to the interatomic periodic spacing of the active layer lattice structure. Tuning results in changes in the lattice structure at the surface of the buffer layer 14 so that the buffer layer 14 is tuned to match the crystallinity of the first active layer 16. For example, the buffer layer 14 can be tuned by mixing more than one tetradymite compound together, or by providing more than more layer of differing tetradymite compounds. Therefore, in various embodiments, the buffer layer 14 comprises a single tetradymite layer or a plurality of tetradymite layers. For example, the buffer layer 14 can be a tetradymite monolayer, a tetradymite bilayer, a tetradymite trilayer, etc. Additionally, the buffer layer 14 can comprise a gradient of at least two tetradymite compounds, wherein the concentration of at least one tetradymite compound either increases or decreases directionally from the buffer layer surface at the substrate to the buffer layer surface that will become a junction between the buffer layer and the layer of semiconducting material. Moreover, the buffer layer 14 can be tuned by doping with an organic or inorganic dopant. Non-limiting examples of dopants include electron donating or accepting elements from group I to group VII, transition metals, rare earth elements, organometallic complexes containing transition metals or combinations and compounds thereof. The buffer layer 14 can comprise a combination of a layers in which some layers consist of a single tetradymite compound, and/or some layers comprise multiple tetradymite compounds and/or some layers comprise a tetradymite compound gradient, wherein none, any, or all of the layers comprise a dopant. In other words, any combination of tetradymite buffer layers 14 can be employed. Electronic doping of the buffer layer is another tunable parameter (from n to p type) with typical carrier concentrations ranging from $10^{18}$-$10^{20}$ cm$^{-3}$. Based on this electronic tunability, both ohmic and Schottky V-VI/II-VI interfaces are possible, which is very important for the optoelectronic device design. This doping increases the functionality of the buffer layer, enabling a wider range of optoelectronic device operation.

In various embodiments, matching the interatomic spacing of two compounds in direct contact with each other (such as a buffer layer and an adjacent active layer) includes compounds with different lattice structures, with similar (or dissimilar) crystalline symmetry, wherein the compounds' interatomic spacing are an integer multiple of the lattice parameter or certain interatomic plane periodicities. In one embodiment, the lattice-matched ratio, between a certain periodic interatomic spacing of the tetradymite buffer layer and a certain periodic interatomic spacing of the active layer grown on the tetradymite buffer layer, is varied in the in the interval of from about 0.98 to about 1.02. In another embodiment, lattice-matching at the interface between the buffer tetradymite layer and the active layer is used for diminishing defect density and stress at the buffer layer-active layer interface.

As used herein the terms "active layer" or "active material" refer to materials or layers that have semiconducting, conducting, or insulating properties. In some embodiments, the active material is a dielectric material, or a bulk heterojunction. The active layers or active materials provide functionality to a device; for example, in a night vision device the active layer is a material that detects long wavelength electromagnetic radiation to form an image. In some embodiments, the active layer or active material is a photovoltaic conversion layer in a solar cell panel. It is understood to those skilled in the art that active layer materials, having certain structures, can preserve the structure while allowing for variations in composition, such as changing anion to cation ratios from the strictly stoichiometric compounds. As shown in FIG. 1, the multilayer stack 10 can comprise a single first active layer 16, or as shown in FIG. 2, the multilayer stack 10A can comprise a first active layer 16 and additional active layers 18, 18', wherein the active layers 16, 18, 18' comprise the same, similar, or different active materials. Therefore, in various embodiments, the multilayer stack comprises a plurality of active layers. Although the multilayer stack 10A of FIG. 2 is shown with three active layers 16, 18, 18', multilayer stacks according to the present technology can have greater than one active layer. For example, a multilayer stack can have 1, 2, 3, 4, 5, 6, 7, 8, 9, 10 or more active layers.

Figure 3:
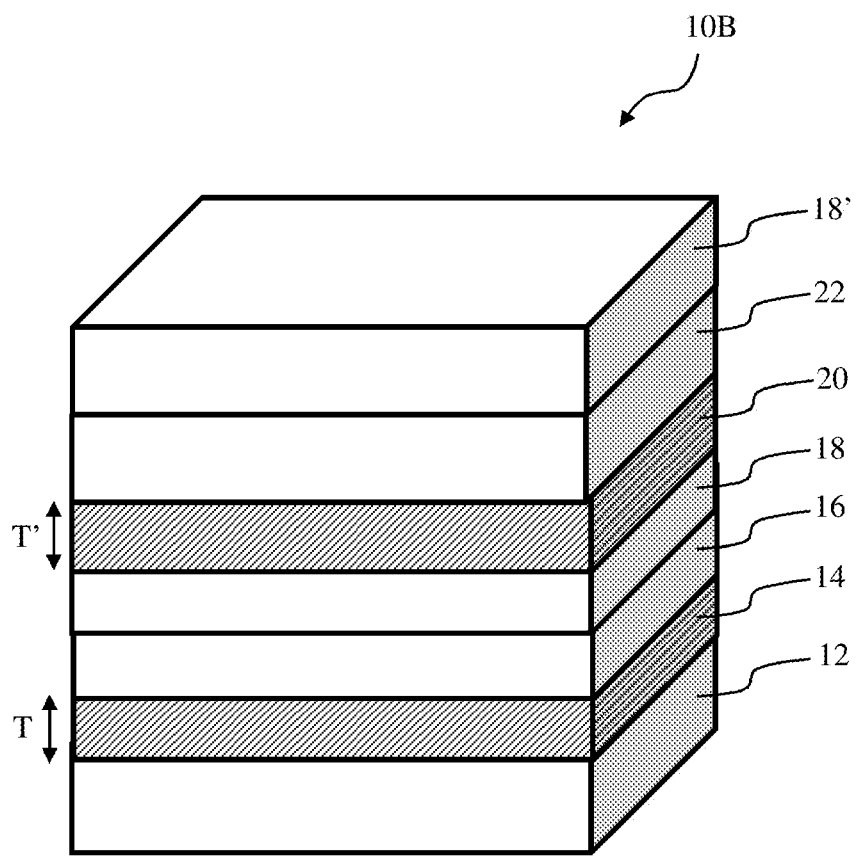
FIG. 3 shows a perspective view of a third multilayer stack according to certain aspects of the present disclosure.

In various embodiments, the present technology provides for a multilayer stack with a plurality of buffer layers. FIG. 3 shows a third multilayer stack 10B, which comprises the same substrate 12, buffer layer 14, and active material 16 components as the multilayer stack 10 of FIG. 1 and the additional active layer 18 of FIG. 2. However, the multilayer stack 10B of FIG. 3 further comprises a second buffer layer 20 positioned between, and in fluent contact with, the additional active layer 18 and a second active layer 22. As shown in FIG. 3, an additional active layer 18' is positioned above, and in fluent contact with, the second active layer 22. By positioning the second buffer layer 20 on the additional active layer 18, another template is developed that allows for a better match between the lattice structure of the second buffer layer 14 and the lattice structure of the second active layer 22. For example, in embodiments where the lattice structure of the additional active layer 18 and the lattice structure of the second active layer 22 are different, such that a lattice mismatch would prevent functional adhesion or result in poor efficiency, the second buffer layer 20 is varied, matched or tuned in regard to the additional active layer 18 and the second active layer 22 to provide a better lattice match, resulting in better adhesion or higher efficiency than if no second buffer layer 20 was present. Therefore, in some embodiments, the second buffer layer 20 comprises a gradient of at least two tetradymite compounds, as described above, wherein the gradient results in a surface with a first lattice structure corresponding to the lattice structure of the additional active layer 18 and a second surface with a second lattice structure corresponding to the lattice structure of the second active layer 22. In other embodiments, the second buffer layer 20 is a tetradymite multilayer, such as a bilayer, wherein the bilayer results in a surface with a first lattice structure corresponding to the lattice structure of the additional active layer 18 and a second surface with a second lattice structure corresponding to the lattice structure of the second active layer 22. The second buffer layer 20 can have a thickness T' of from about 0.2 nm to about 100 μm. In some embodiments, the second buffer layer 20 has a thickness T' of from about 1 nm to about 1 μm. Although in some embodiments the second buffer 20 layer is a passive layer that promotes epitaxy and higher efficiencies, in other embodiments, the second buffer 20 layer is also an active electronic layer.

With reference to FIGS. 1-3, the first active layer 16, or additional active layers 18, 18' can comprise any semiconducting material or insulating material typically used in the art. For example, the active layer 16 can be a II-VI alloy or a hybrid Si-II-VI alloy, a hybrid Ge-II-VI alloy, a hybrid Sn-II-VI alloy, a hybrid Pb-II-VI alloy, a heterovalent cation compound, such as II-IV-V, or a III-V alloy. The semiconducting material can be organic or inorganic. In various embodiments, the semiconductor material is a semiconductor compound of the $A_xB_{1-x}C_yD_{1-y}$ type, where x and y are 0, 1 or values between 0 and 1, the elements A and B are individually selected from the group consisting of Cd, Zn, Hg, Mg, Be, Pb, Sn, Ge, and Si, and the elements C and D are individually selected from the group consisting of Te, Se and S. In various embodiments, the semiconductor material can also be selected from the group consisting of $Cu_2ZnSnSe_4$, $Cu_2ZnSnS_4$, $CuInSe_2$, $CuInS_2$, $CuIn_xGa_{1-x}Se_2$, and $ZnSnN_2$, wherein x is equal to or less than 1. In some embodiments, the active material is a hybrid between Si, Ge, Pb, Sn, or C and a semiconducting alloy, such as CdSe, CdS, CdTe, ZnTe, ZnS, ZnSe, MgSe, MgTe, MgS, HgTe, HgSe, HgS, BeTe or BeSe or a semiconductor of the $A_xB_{1-x}C_yD_{1-y}$ type, where x and y are 0, 1 or values between 0 and 1, the elements A and B are individually selected from the group consisting of Cd, Zn, Hg, Mg, Be, and the elements C and D are individually selected from the group consisting of Te, Se and S. Non-limiting examples of semiconducting layers with tetradymite structure include $Bi_2Te_3$, $Sb_2Te_3$ and $Bi_2Se_3$ and their ternary alloys, or other similar ternary alloys with tetradymite structure, such as $Bi_2Te_2Se$, $Bi_2Te_2S$, $Bi_2Se_2S$, $Sb_2Te_2Se$, $Sb_2Te_2S$, $Bi_2Se_2Te$, $Bi_2Te_{1.5}S_{1.5}$ and $Bi_2Te_{1.6}S_{1.4}$. In various embodiments, the semiconductor layer can be a thermoelectric material, a solar energy photovoltaic, a topological material such as a topological insulator, a visible light photodetection layer, a night vision semiconductor layer, or an array, such as a focal plane array, for converting long wavelength electromagnetic radiation with wavelength of 1-20 μm into electrical signals. As described above, the multilayer stacks provided herein can be a component of an optoelectronic device, such as a solar cell, a photodetector, or a light emitting device. Light emitting devices include light emitting diodes, inflexible displays, and flexible displays.

Figure 4:
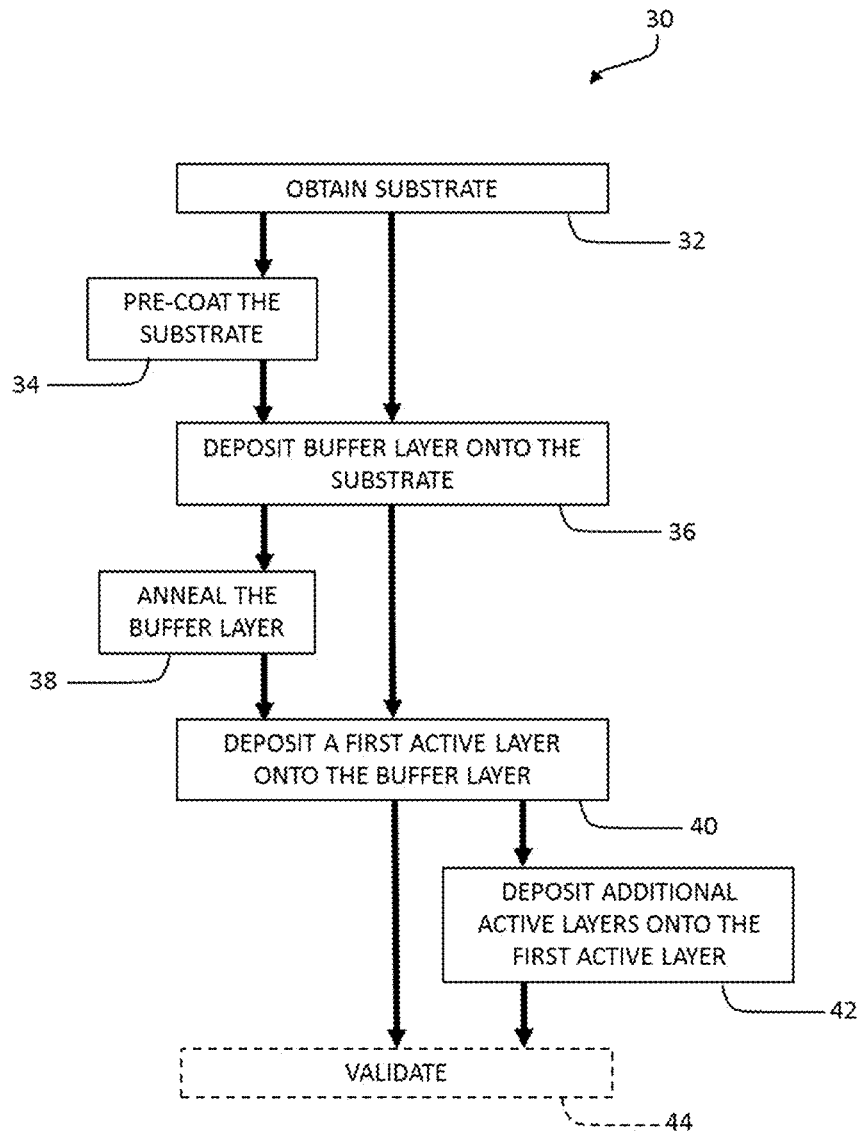
FIG. 4 is a flow chart showing a method for fabricating a multilayer stack according to certain aspects of the present disclosure.

As shown in FIG. 4, the current technology further provides a method 30 for fabricating a multilayer stack. In box 32, the method 30 optionally comprises obtaining a substrate. The substrate can be any substrate described herein. For example, in various embodiments, the substrate is amorphous (non-crystalline), or crystalline. Crystalline substrates are either single-crystalline or poly-crystalline. Non-limiting examples of non-crystalline or crystalline materials include plastics, polymers, oligomers, and metals. In various embodiments, the non-crystalline or crystalline material is silicon, silica (silicon dioxide or silicon oxide), aluminum oxide, sapphire, germanium, gallium arsenide (GaAs), indium phosphide, an alloy, or KAPTON® polyimide film developed by DuPont (Wilmington, Del.). Non-limiting examples of non-crystalline materials include glass, plastics, polymers, oligomers, and metals. In one embodiment, the non-crystalline material is KAPTON® polyimide film developed by DuPont.

As shown in box 34, in some embodiments, the method 30 optionally comprises pre-coating the substrate. The substrate can be pre-coated with an inorganic material, an organic material, graphite, or a conducting optically transparent oxide. Non-limiting examples of conducting optically transparent oxides include doped and undoped inorganic compounds ZnO, $In_2O_3$, $SnO_2$, $Cr_2O_3$, $CuCrO_2$, $CuCr_{0.5}Al_{0.5}O_2$, $Mg_{1-x}Zn_xO$, $Ga_2O_3$, CdO, $CuGaO_2$ and alloys thereof, wherein x is equal or smaller than 1, or organic compounds including poly(3,4-ethylenedioxythiophene), poly(4,4-dioctylcyclopentadithiophene). Non-limiting examples of dopants include electron donating or accepting elements from group I to group VII, transition metals, rare earth elements, organo-metallic complexes containing transition metals and combinations and compounds thereof. As described above, the substrate can vary in shape and size. In various embodiments, only one surface of the substrate is pre-coated. In other embodiments, the entire substrate is pre-coated. Pre-coating the substrate can be performed by any method typically used in the art. Non-limiting examples of methods for pre-coating the substrate include dip coating, vapor phase growth, chemical vapor deposition, liquid phase epitaxy, vapor jet printing, organic vapor deposition, molecular beam epitaxy (MBE), plasma discharge coating, sputtering, electron beam evaporation, metallorganic chemical vapor deposition (MOCVD), vacuum evaporation, spray coating, spray coating with post deposition annealing, electrodeposition, close space sublimation, vapor jet printing, and atomic layer deposition.

Whether the substrate is pre-coated or not pre-coated, box 36 of the method 30 comprises depositing a buffer layer onto the substrate. In accordance with the present technology, the buffer layer is a tetradymite buffer layer as described above. Accordingly, the tetradymite buffer layer can comprise a single buffer layer, multiple buffer layers, a buffer layer gradient, a dopant, or combinations thereof. Therefore, the buffer layer can be tuned to match the crystallinity of a subsequent active layer to be deposited onto the buffer layer. In one embodiment, the tetradymite buffer layer has a first lattice spacing and a subsequent active layer has a second lattice spacing, and the method further comprises tuning the tetradymite buffer layer so that the first lattice spacing matches the second lattice spacing. In various embodiments, the tetradymite buffer layer is deposited on one or more than one surface of the substrate. In embodiments where the substrate is pre-coated, the tetradymite buffer layer is deposited on a surface that is pre-coated or on a surface that was not pre-coated. The tetradymite buffer layer can be either an active or inactive layer of the multilayer stack.

Depositing the buffer layer onto the substrate can be performed by any method typically used in the art. Non-limiting examples of methods for depositing the buffer layer onto the substrate include vapor phase growth, chemical vapor deposition, liquid phase epitaxy, vapor jet printing, organic vapor deposition, molecular beam epitaxy (MBE), plasma discharge coating, sputtering, electron beam evaporation, metallorganic chemical vapor deposition (MOCVD), vacuum evaporation, spray coating, spray coating with post deposition annealing, electrodeposition, close space sublimation, vapor jet printing, or atomic layer deposition. In various embodiments, the size of the substrate dictates the method for depositing the buffer layer onto the substrate. For instance, on an occasion where the substrate is too large to fit into an MBE chamber, the buffer layer can be deposited by sputtering or spraying. In some embodiments, depositing the buffer layer onto the substrate comprises annealing the buffer layer, such as by thermal annealing. As shown in box 38 of the method 30, in some embodiments, depositing the buffer layer on the substrate includes annealing the buffer layer. Annealing can be performed before, during, or after a subsequent step of depositing a first active layer onto the buffer layer as depicted in box 38. Annealing can be performed by any method commonly used in the art, such as, for example, rapid thermal annealing (RTA) or furnace annealing. In various embodiments, the method 30 comprises depositing a buffer, annealing the buffer layer, depositing a second buffer layer, and annealing the second buffer layer. Accordingly, additional buffer layers can be deposited and annealed.

In box 40, the method 30 comprises depositing a first active layer onto the buffer layer. As described above, the first active layer can comprise a semiconducting material, a conducting material, or an insulating material. Depositing the active layer onto the buffer layer can be performed by any method commonly used in the art, including the same methods described above for depositing the buffer layer onto the substrate. Therefore, the first active layer can be deposited onto the buffer layer by vapor phase growth, chemical vapor deposition, liquid phase epitaxy, organic vapor deposition, molecular beam epitaxy (MBE), plasma discharge coating, sputtering, electron beam evaporation, metallorganic chemical vapor deposition (MOCVD), vacuum evaporation, spray coating, spray coating with post deposition annealing, electrodeposition, close space sublimation, vapor jet printing, or atomic layer deposition. In various embodiments the active layer is deposited onto the buffer layer by the same method as the buffer layer is applied to the substrate. Additionally, the active layer can be deposited to the buffer layer at a time immediately following the time in which the buffer layer is applied to the substrate. In other embodiments, the method of depositing the active layer onto the buffer layer is different from the method of depositing the buffer layer onto the substrate.

In various embodiments, the multilayer stack comprises a plurality of active layers. Therefore, as shown in box 42, in various embodiments the method 30 optionally comprises depositing at least one additional active layer onto the first active layer. The at least one additional active layer can comprise the same active material as the first active layer, or it can comprise a different active material than the first active layer. Depositing the additional active layers onto the first active layer can be performed by any method commonly used in the art, including the same methods described above for depositing the first active layer onto the buffer layer.

In various embodiments, two adjacent active layers may have lattice structures that are not well matched. In such embodiments, the method 30 comprises depositing an additional tetradymite buffer layer between the two active layers with mismatched lattice structures, such as shown in FIG. 3. As disclosed herein, the additional tetradymite buffer layer can be a single buffer layer, a plurality of buffer layers, i.e., a bi-layer, tri-layer, etc., or a gradient buffer layer. Each additional tetradymite buffer layer can be annealed prior to adding additional buffer layers or active layers.

As shown in box 44 of FIG. 4, the method 30 optionally comprises validating the quality of the multilayer stack. Validating comprises measuring a property of the multilayer stack and optionally adjusting the multilayer stack to improve the property. In an embodiment, validating comprises measuring surface properties of the buffer layer and/or the active layer by x-ray, electron, or ion scattering. Validating can be performed at various times during performance of the method 30. For example, the surface properties of the buffer layer can be measured during or after deposition of the buffer layer. Likewise, the surface properties of the active layers can be measured during or after deposition of the active layers. In another embodiment, validating comprises measuring optoelectronic qualities of the multilayer stack by optical measurements during or after depositing the buffer layer and the active layers. Non-limiting examples of optical measurements include fluorescence, reflectivity, and absorption. In one embodiment, more than one optical measurement is performed to validate the quality of the multilayer stack. In some embodiments, validating comprises validating the quality of the multilayer stack by focusing an electromagnetic beam or an ion beam onto a surface of the multilayer stack and measuring a property of the multilayer stack. The electromagnetic beam can be an x-ray, electron beam, visible light beam, infrared light beam, or ultraviolet light beam. Optionally, the multilayer stack can be adjusted to improve the property. Non-limiting examples of properties that can be measured include buffer layer thickness, active layer thickness, buffer layer planarity, active layer planarity, crystalline orientation, crystallographic texture, bandgap, defect densities, charge carrier generation rates from electromagnetic beam exposure, charge carrier lifetimes, charge carrier mobilities, charge carrier radiative recombination, and combinations thereof. In various embodiments, the electromagnetic beam is an x-ray, electron-beam, visible light beam, infrared light beam, or ultraviolet light beam. In one embodiment, validating is performed by reflection high-energy electron diffraction (RHEED).

Embodiments of the present technology are further illustrated through the following non-limiting examples.

Example 1

II-VI Films Grown on Amorphous Substrates Using Tunable Buffer Layers

The use of tetradymite heterostructures for controlling highly-oriented growth of II-VI films on amorphous substrates, including CdSe and ZnTe films on fused silica and flexible polyimide (Kapton® polyimide from DuPont) substrates is described. Wurtzite CdSe films deposited on fused silica substrates have much improved optoelectronic properties when using tetradymite buffer layers, in sharp contrast to the case of CdSe films grown without buffer layers. This approach can reduce the carrier scattering rates by at least one order of magnitude compared to direct growth on fused silica.

Thin film deposition is performed with a custom-made Thermionics ultra-high vacuum molecular beam epitaxy (MBE) chamber (Thermionics, Hayward, Calif.). Standard single-filament effusion cells are used for evaporation of Bi, Zn, $Sb_2Te_3$ and CdSe, while a custom dual-filament cell (Vesco-NM) is used for Te evaporation. The evaporated material purity is 99.999% or better, as supplied by Alfa Aesar. Before insertion into the MBE chamber, fused silica substrates are initially sonicated in an acetone bath, then cleaned in a $H_2SO_4/H_2O_2$ solution for 30 minutes, and then rinsed repeatedly in de-ionized water. KAPTON® HN polyimide substrates from DuPont (Wilmington, Del.) are immersed in boiling methanol several times, then dried with pressurized air and immediately loaded into the MBE chamber. In situ thin film crystallinity during deposition is monitored using reflection high-energy electron diffraction (RHEED) using a kSA-400 data-acquisition system (k-Space Associates, Inc., Dexter, Mich.). During deposition of $Sb_xBi_{2-x}Te_3$ buffer layers, the substrate temperature is varied from room temperature (RT) to 300° C. A prescription of growth and annealing conditions is used that optimizes the buffer layer quality, for example lower temperatures to promote substrate coverage, and annealing at higher temperatures to improve crystallinity and surface morphology. A non-limiting example of a fabrication procedure is provided herein for the case of CdSe layers grown on fused silica and Kapton® HN polyimide substrates from DuPont (Wilmington, Del.) using tetradymite buffer layers.

For the deposition of ternary $Sb_xBi_{2-x}Te_3$ buffer layers, a substrate temperature is selected in the range of from about room temperature (RT) to about 320° C., depending on the particular substrate being used. For the case of fused silica and Kapton® polyimide (DuPont) substrates, growing $Sb_xBi_{2-x}Te_3$ layers at >200° C. results in film discontinuities, while films become continuous with lower growth temperatures. Nearly optimal growth conditions that assure good substrate coverage, film adherence and crystallization are realized when growing first a polycrystalline $Bi_2Te_3$ nucleation layer at about 180° C. In the next step, a highly-oriented, c-plane textured film is obtained when the $Bi_2Te_3$ nucleation layer is annealed at 310±10° C. This post-deposition annealing (5-90 minutes) promotes film crystallization and surface flatness and is performed by exposing the surface to Te flux, which avoids surface stoichiometry changes due to onset of buffer layer sublimation at a temperature of about 320° C. or higher. The c-plane film texture is maintained through the overgrowth of additional $Sb_xBi_{2-x}Te_3$ layers at ~250° C. In the final step, the deposition of CdSe and ZnTe is performed at about 300° C.

Extensive ex situ characterization of the sample crystallinity and morphology employed X-ray diffraction (XRD), including synchrotron measurements at Advanced Photon Source, Argonne National Laboratory (Lemont, Ill.), transmission electron microscopy (TEM) with JEOL 3011 high resolution electron microscopy (NREM; JEOL Ltd, Tokyo, Japan) and atomic force microscopy (AFM) with a Veeco Dimension Icon atomic force microscope (Veeco Instruments, Inc., Plainview, N.Y.), as well as scanning electron microscopy. The optoelectronic properties are determined using both ultrafast spectroscopy and photoluminescence measurements (PL). A Control Development scanning spectrometer (South Bend, Ind.) is used for PL. The carrier recombination and diffusivity are evaluated with spatially- and temporally-resolved near-infrared (1550 nm) transmission measurements following excitation at 519 nm based on asynchronous optical sampling (ASOPS) technique. Overlapping pump and probe beams are used for lifetime measurements (see FIG. 8B), while displaced beams are used for estimating carrier diffusivity (see FIG. 8C). The CdSe and ZnTe samples grown on fused silica and polyimide substrates, respectively, are then compared to CdSe (0001), ZnTe (111) and GaAs (100) single crystals in PL and ASOPS measurements.

Ternary tetradymite solid solutions, e.g., $Sb_xBi_{2-x}Te_3$, are used to lattice match, i.e., tune the II-VI optoelectronically relevant layer (CdSe or ZnTe) to the buffer layer. This lattice matching is beneficial in obtaining high-quality optoelectronic material. The in-plane RT lattice parameters of $Sb_2Te_3$ and $Bi_2Te_3$ binary compounds are 4.262 Å and 4.384 Å, respectively. Vegard's law is used to interpolate ternary alloy matching with the CdSe or ZnTe layers in addition to adjusting for thermal expansion at the deposition temperature.

Figures 5A, 5B, 5C, 5D:
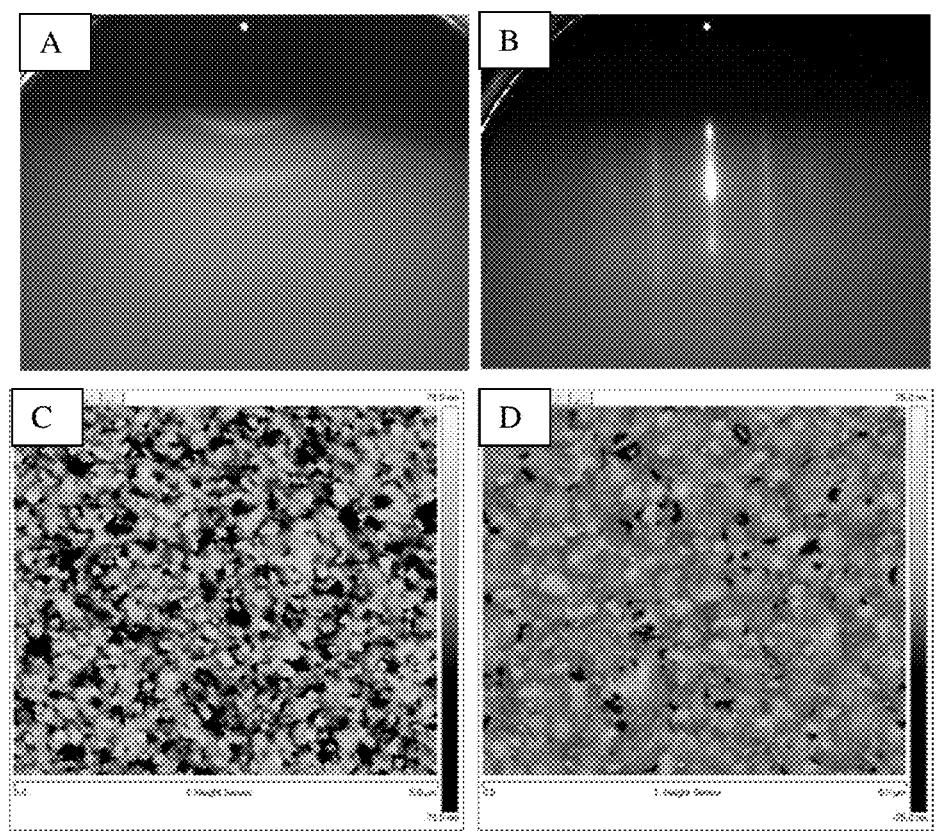
FIGS. 5A-5D show Reflection High Energy Electron Diffraction (RHEED) images of CdSe grown on a non-crystalline substrate (5A) without a buffer layer and (5B) with a buffer layer, and atomic force microscopy (AFM) images of the CdSe layer on a substrate (5C) without a buffer layer and (5D) with a buffer layer.

FIGS. 5A-5B show a comparison of RHEED images for CdSe grown on fused silica without (5A) and with (5B) the $Sb_xBi_{2-x}Te_3$ buffer layer, respectively. It can be seen that the CdSe film grown directly on fused silica exhibits diffraction rings characteristic for polycrystalline structure (FIG. 5A), while the corresponding film grown on nearly-matched $Sb_{1.68}Bi_{0.32}Te_3$ (FIG. 5B) instead shows a streaky diffraction pattern specific to the highly-oriented growth of CdSe films. A mixture of characteristic in-plane orientations is observed, i.e., [1$\bar{1}$00] and [11$\bar{2}$0], due to isotropic orientation distribution of in-plane domains. Nevertheless, the streaky RHEED pattern also reveals that single c-plane grain orientation is strictly preserved in the entire CdSe film. Similar results are obtained for ZnTe grown on fused silica and CdSe on flexible Kapton substrates.

For revealing the impact of introducing the $Sb_xBi_{2-x}Te_3$ buffer layer prior to the CdSe deposition, we analyzed the film morphologies with AFM as shown in FIGS. 5C and 5D for two samples, without and with the buffer layer, respectively. When using buffer layers, the CdSe films exhibit a much smoother surface, larger grain size and lower pinhole density, providing clear evidence for the improvement in the CdSe quality.

In order to confirm the RHEED and AFM results, complementary XRD measurements are performed and shown in FIG. 6A. For the buffer layer only (000l) peaks are observed (l is an integer multiple of 3), as expected for the c-plane oriented films with tetradymite structure. The remaining peaks are indexed to the c-plane wurtzite reflections of the CdSe film grown atop the buffer. The XRD measurements on CdSe grown directly on fused silica without buffer layer (not shown), are consistent with the polycrystalline RHEED pattern (FIG. 5A), while the CdSe film grown on buffer layer grows c-plane oriented and is highly-oriented. Rocking curve scans around (00015) buffer layer reflection and (0002) CdSe layer reflection (see inset from FIG. 6A) are used to monitor the individual layers of the heterostructure. Notably, interdependence between the rocking curve full-width-at-half-maximum (FWHM) of the top layer and the buffer layer is observed. As shown in FIG. 6B, with a line to guide the eye, as the FWHM of the buffer increases, so too does the FWHM of the CdSe layer grown on top. Although this plot includes data on samples of varying composition, the trend still remains the same, showing that the crystalline quality of CdSe film is strongly correlated to that of the buffer layer. Thus, growth optimization for the tetradymite buffer layer provides a key tool for structural control of II-VI overlayers on amorphous substrates.

Cross-sectional TEM of these multilayer structures shows that the buffer layers remain distinct throughout the sample growth despite using elevated growth temperatures. One might anticipate intermixing between the layers, given the fact that CdSe grows best at what is normally used for an annealing temperature for the buffer layers, but as seen by the distinct phase contrast between layers in TEM images of FIGS. 7A and 7B, layers maintain their integrity throughout the growth process. In order to enable TEM measurements of individual grains, the cross-section thickness of the TEM sample are trimmed down to about 80 nm, smaller than the typical grain size observed with AFM. The high resolution TEM image from FIG. 7B captures a select area containing a single grain, showing an essentially atomically sharp interface between the $Sb_2Te_3$ and CdSe layers. The known quintuple layer (QL) lattice spacing for the $Sb_2Te_3$ and $Bi_2Te_3$ (as well as alloys thereof) of about 1 nm is clearly observed in the buffer layers. Above the interface and inside the CdSe layer, a lattice spacing of about 3.5 Å is observed, which is characteristic for the c-axis of the wurtzite CdSe phase, in support of the XRD results from FIG. 6A. These TEM studies indicate that CdSe growth on the buffer layer occurs epitaxially at the grain level. Because in-plane orientation of individual grains is isotropic, the uniform perpendicular orientation of all constituent grains may become useful in applications that use perpendicular charge transport.

PL spectra for representative CdSe samples grown with and without the buffer layer, as well as PL on a bulk sample reference are shown in FIG. 8A. The CdSe film grown on nearly-matched $Sb_2Te_3$ layer exhibits a PL emission with peak value highly consistent with the bulk CdSe (0001) crystal and the characteristic 1.74 eV wurtzite bandgap. Similarly, CdSe films grown on flexible KAPTON® polyimide (Dupont) substrates using tetradymite buffer layers also show PL emission peak at the bulk value. Peak broadening is also observed in the CdSe film samples compared to bulk reference, possibly due to structural disorder, such as local bandgap modulation due to strain variation. On the other hand, the PL of CdSe films grown on tetradymite buffer layers do not show any evidence of deep-traps, supporting the high quality assessment of our films. In contrast, the CdSe film grown without buffer layer exhibits a PL emission peak that is red shifted. This PL red shift also appears when using buffer layers with mismatched composition (e.g., $Bi_2Te_3$) or when lower growth temperatures are used, a trend verified to hold in many samples. The PL red shift can be attributed to trapping and charge localization in contrast to the case of CdSe grown on nearly-matched $Sb_2Te_3$ buffer layer, which shows bulk-like behavior.

Additional measurements of integrated PL intensity as a function of pumping power at 519 nm are shown in the inset of FIG. 8A, where the corresponding carrier densities are estimated from the known bulk absorption coefficients and the pump laser spot size of about 4 µm. Optical excitation is in the linear absorption regime, with a maximum pump-laser fluence <3 µJ/cm², which is about 1-2 orders of magnitude smaller than the two-photon absorption regime. Nevertheless, the quadratic PL emission scaling with carrier density for both the CdSe bulk and thin film samples is observed, which is a behavior characteristic for a transient carrier population dominating the intrinsic carrier density. It is worth noting here that this nonlinear PL scaling with the pumping strength is of interest in various applications, due to its higher efficiency. Although the relative carrier density dependence of normalized PL intensity is similar in the CdSe single-crystal and film samples, the PL intensity for the CdSe films grown on fused silica is about 30 times smaller compared to the single-crystal reference. This behavior can be better understood using time-resolved measurements of carrier dynamics as described below.

The carrier dynamics studies in the samples are based on time-resolved transmission spectroscopy measurements via ASOPS, which uses optical pumping at 519 nm and time-delayed optical probing at 1550 nm. A comparison between the resulting lifetimes is shown in FIG. 8B, where large differences among samples are observed. At small carrier density (about $10^{17}$ cm$^{-3}$), a long lifetime (about 3.2 ns) is observed in bulk CdSe, a very short lifetime (about 15 ps) is observed in CdSe grown directly on fused silica, and an intermediate lifetime (about 300 ps) is observed in CdSe grown with optimized buffer layers. The short lifetime in the CdSe grown directly on fused silica indicate more recombination channels present in this sample, possibly due to larger trap density or scattering at the grain boundaries. On the other hand, the lifetime ratio between the bulk CdSe and the film with a tetradymite buffer layer correlates with the corresponding PL intensity reduction in the CdSe film relative to bulk, pointing to the origin of the PL intensity reduction in the films. A smaller lifetime corresponds to a reduced intensity in the time integrated PL spectrum. Compared to bulk, defect-related lifetime reduction in CdSe grown with the buffer layer is certainly much smaller than in the film grown directly on fused silica, approaching the bulk value. Further optimization of buffer layer composition as well as growth/annealing temperatures is expected to diminish the defect-related lifetime reduction in the II-VI films.

To estimate the carrier diffusivities, the transient absorption is measured with ASOPS using spatially-displaced pump and probe beams focused on the CdSe surface. This geometry can be used to estimate carrier diffusivity. Nevertheless, appropriately accounting for the density dependence of carrier relaxation for reliable estimation of the carrier diffusivity is crucial in these types of measurements, because erroneous results are produced otherwise. Consequently, time-resolved transmission traces are also acquired as a function of spatial displacement relative to the pump beam position along the sample surface. This geometry can be used to monitor the spatial distribution of carriers as a function of time after pump excitation, particularly the carrier diffusion dynamics. Because the pump spot intensity profile is Gaussian, the generated carrier density along the sample surface has the same spatial profile, driving carrier diffusion. Moreover, immediately after the laser pulse, but before recombination has occurred, the generated carriers can diffuse away from the pump beam center and along the sample surface. The diffusion of carriers is driven by the local carrier density gradient along the sample surface, which follows the Gaussian excitation profile. A probe displacement with respect to the pump spot position can in turn be used to monitor carrier diffusion. In this approach, it is assumed that the relaxation time of carriers is the same at all sample locations within the spatial profile of the pump beam. It is observed that this assumption is not valid in the samples, because the relaxation time is dependent on the average pump power. Consequently, a different technique is needed to account for the spatial dependence of carrier relaxation time. To address this issue, a time-resolved transmission measurement is performed with probe spot displaced from the pump spot center. A smaller initial carrier density is probed when using probe displacement from the center of the pump spot. Nevertheless, the initial amplitude of the time-resolved transmission signal correlates with the local carrier density. Next, a complementary measurement is performed with centered pump and probe spots while adjusting the pump beam intensity to match the time-resolved transmission amplitude for the displaced spot case. This procedure assures that the initial average carrier density within the probe spatial spot is the same for the two complementary time-resolved transmission measurements, which significantly suppresses the time-resolved transmission relaxation time variation with the carrier density. The two time-resolved transmission complementary measurements are then divided to monitor the diffusion component of carrier dynamics. In FIG. 8C, the resulting ratio of time-resolved transmission signals for the CdSe single crystal and the CdSe film grown on nearly-matched $Sb_{1.68}Bi_{0.32}Te_3$ buffer layer grown on fused silica substrate is shown. The ratio of time-resolved transmission signals grows quickly within the first 100 ps, due to carrier diffusion, followed by a slower growth on a longer time scale. For the case of the CdSe film sample, the time-resolved transmission signal is modulated by acoustic dynamics inside the buffer layer (not shown), but the rise of slowly-varying time-resolved transmission background is still similar to the CdSe bulk sample. This result implies that the carrier diffusivity dynamics are probed at the early time delays in both samples, while at longer time delays the diffusion effects are negligible. This behavior is attributed to free electron diffusion at early time delays, followed by formation of excitons at longer time delays, which are characterized by much smaller diffusivities. The temporal dependency of the pump spot Gaussian width, w, due to carrier diffusion can be obtained from:

$$\frac{I(t)}{I_0} = e^{-\frac{d^2}{2}\left(\frac{1}{w^2} - \frac{1}{w_0^2}\right)},$$

where I(t) is the time-resolved transmission corresponding to a displacement, d, between the pump and probe spots on the sample, $I_0$ is the time-resolved transmission measured at the center of the pump spot, and $w_0$ is the Gaussian width before the pump excitation. The $w^2=11.08$ Dt+$w_0^2$ relation is then used for estimating the carrier diffusion constant.

This approach is applied within the first 100 ps corresponding to a time interval preceding the carrier relaxation and exciton formation. Accordingly, a carrier diffusivity of about 5 cm$^2$/s is estimated for the CdSe film and about 20 cm$^2$/s for the CdSe single crystal. Using the time-resolved transmission relaxation times and these diffusivities, carrier diffusion lengths of 500 nm for the CdSe film and 2.5 μm for the CdSe single crystal are estimated. Preliminary results for the CdSe grown on fused silica using a nearly-matched buffer layer indicate diffusion lengths of 500 nm compared to a bulk CdSe crystal with diffusion lengths of roughly 2.5 μm.

The use of tetradymite buffer layers has more far-reaching consequences than growing materials on amorphous or non-crystalline substrates. While developing growth techniques of II-VI/VI compounds on V-VI tetradymite buffer layers, epitaxial II-VI/V-VI heterostructures on lattice-mismatched crystalline substrates such as Al$_2$O$_3$(0001) and Ge(111) were explored, which are important for optoelectronic applications due to their commercial availability in large wafer format (greater than 150 mm in diameter). The use of additional single crystalline substrates, such as GaP, MgAl$_2$O$_4$, MgO, InSb, GaAs, and InAs was also explored. Growth on crystalline substrates produces higher homogeneity of domains as evidenced from RHEED pattern anisotropy, i.e., epitaxial heterostructure locking to the substrate occurs. It is interesting to note that the range of lattice parameters for tetradymite buffer layers covers important II-VI wide-bandgap semiconductors for PV and LED applications, as well as the growth of smaller-bandgap II-VI semiconductors such as Cd$_x$Hg$_{1-x}$Se, PbSe, PbS, etc., which can be used for infrared detector applications. Because the integration of epitaxial tetradymite buffer layers on mismatched crystalline substrates appears not to be an obstacle, their use in epitaxial overgrowth of many II-VI compounds is a promising avenue. Here, this technique is applied to the growth of wide-bandgap II-VI compounds, including epitaxial growth of CdSe films with wurtzite structure and ZnTe films with zinc blende structure.

To summarize, II-VI/V-VI heterostructures with c-plane oriented tetradymite buffer layers can be grown, in one embodiment, on amorphous substrates by MBE methods in accordance with certain aspects of the present disclosure. Overall, the use of tetradymite buffer layers substantially improves the crystallinity, grain size and pinhole density of CdSe films, correlating with the time-resolved optical observation of promising carrier diffusion lengths in these films (about 500 nm). Via solid solutions of V-VI tetradymite compounds, one can achieve lattice parameter tunability (4.1 to about 4.4 Å) in the c-plane, which can accommodate a large variety of other chalcogenide semiconductor compounds, as shown in FIG. 9. Specifically, the realization of high-quality CdSe on fused silica and flexible Kapton substrates enables control of highly-oriented II-VI compound fabrication on amorphous substrates. These results have important implications for large-scale fabrication of optoelectronic devices, including solar cells, LED's, lasers, and detectors working in the visible or infrared spectral regions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:
1. A multilayer stack comprising:
 a. a substrate, wherein the substrate comprises a non-crystalline, amorphous, or polycrystalline material;
 b. a first layer of an active material having a first lattice structure with a first lattice spacing defined by a first interatomic periodic spacing; and
 c. a buffer layer positioned between the substrate and the first layer of active material, wherein the buffer layer comprises a tetradymite compound having a second lattice structure with a second lattice spacing defined by a second interatomic periodic spacing that is varied, matched or tuned with respect to the first interatomic periodic spacing of the first lattice structure, wherein the tetradymite compound is:
 a ternary tetradymite compound selected from the group consisting of Bi$_{2-x}$Sb$_x$Te$_3$ compounds, wherein x is 1 or values between 0 and 1, Bi$_2$Te$_2$Se, Bi$_2$Te$_2$S, Bi$_2$Se$_2$S, Sb$_2$Te$_2$Se, Sb$_2$Te$_2$S, Bi$_2$Se$_2$Te, Bi$_2$Te$_{1.5}$S$_{1.5}$, Bi$_2$Te$_{1.6}$S$_{1.4}$, Sb$_{1.68}$Bi$_{0.32}$Te$_3$, alloys therefore, and combinations thereof,
 a quaternary tetradymite compound selected from the group consisting of (Bi$_{1-x}$Sb$_x$)$_2$(Te$_{1-y}$Se$_y$)$_3$, (Bi$_{1-x}$Sb$_x$)$_2$(Te$_{1-y}$S$_y$)$_3$, (Bi$_{1-x}$Sb$_x$)$_2$(S$_{1-y}$Se$_y$)$_3$, wherein x and y are values between 0 and 1, alloys thereof, and combinations thereof, or
 combinations of the ternary and the quaternary tetradymite compounds.

2. The multilayer stack according to claim 1, wherein the substrate comprises silicon, silica (silicon dioxide or oxide), aluminum oxide, sapphire, germanium, gallium arsenide (GaAs), silicon carbide, gallium phosphide, gallium nitride, indium phosphide, zinc oxide, aluminum nitride, bismuth germanate, or oxides, nitrides, metals or alloys thereof, glass, plastic, polyimide, polymer, metal, oligomer, and mixtures thereof.

3. The multilayer stack according to claim 1, wherein the substrate is a non-conducting, semiconducting, or metallic material.

4. The multilayer stack according to claim 1, wherein the substrate is composed of an organic or inorganic material.

5. The multilayer stack according to claim 1, wherein the substrate is pre-coated with at least one layer of an organic or inorganic material selected from the group consisting of graphite, graphene, graphane, graphene oxide, graphite oxide, pentacene, anthracene, rubrene, polyacetylene, polypyrrole, and polyaniline or copolymers or stacked mixtures thereof.

6. The multilayer stack according to claim 1, wherein the substrate is pre-coated with at least one layer selected from the group consisting of a conducting layer, a non-conducting layer, an optically transparent layer, a non-transparent layer, and mixtures thereof.

7. The multilayer stack according to claim 6, wherein the at least one layer pre-coated on the substrate is an inorganic compound selected from the group consisting of ZnO, $In_2O_3$, $SnO_2$, $Cr_2O_3$, $CuCrO_2$, $CuCr_{0.5}Al_{0.5}O_2$, $Mg_{1-x}Zn_xO$, $Ga_2O_3$, CdO, $CuGaO_2$, and alloys thereof, wherein x is equal or smaller than 1, or an organic compound selected from the group consisting of poly(3,4-ethylenedioxythiophene), and poly(4,4-dioctylcyclopentadithiophene).

8. The multilayer stack according to claim 1, wherein the active material is a semiconductor of the $A_xB_{1-x}C_yD_{1-y}$ type, where x and y are 0, 1 or values between 0 and 1, the elements A and B are individually selected from the group consisting of Cd, Zn, Hg, Mg, Be, Pb, Sn, Ge, and Si, and the elements C and D are individually selected from the group consisting of Te, Se and S.

9. The multilayer stack according to claim 1, wherein the active material is a semiconductor of the $A_xB_{1-x}C_yD_{1-y}$ type, where x and y are 0, 1 or values between 0 and 1, the elements A and B are individually selected from the group consisting of B, Al, Ga and In, and the elements C and D are individually selected from the group consisting of N, P, As and Sb.

10. The multilayer stack according to claim 1, wherein the active material is a semiconductor selected from the group consisting of $Cu_2ZnSnSe_4$, $Cu_2ZnSnS_4$, $CuInSe_2$, $CuInS_2$, $CuIn_xGa_{1-x}Se_2$, and $ZnSnN_2$, wherein x is equal to or less than 1.

11. The multilayer stack according to claim 1, wherein the active material is a hybrid between Si, Ge, Pb, Sn or C and a semiconductor of the $A_xB_{1-x}C_yD_{1-y}$ type, where x and y are 0, 1 or values between 0 and 1, the elements A and B are individually selected from the group consisting of Cd, Zn, Hg, Mg, Be, and the elements C and D are individually selected from the group consisting of Te, Se and S.

12. The multilayer stack according to claim 1, wherein the buffer layer comprises grains, wherein at least 75% of the grains are directionally aligned in at least one crystallographic axis.

13. The multilayer stack according to claim 1, wherein the buffer layer has a thickness of from about 0.2 nm to about 100 µm.

14. The multilayer stack according to claim 1, wherein the buffer layer is coated directly onto the substrate.

15. The multilayer stack according to claim 1, wherein the multilayer stack is a component of an optoelectronic device.

16. The multilayer stack according to claim 15, wherein the optoelectronic device is a solar cell, a photodetector, or a light emitting device.

17. The multilayer stack according to claim 16, wherein the light emitting device is a light emitting diode, an inflexible display, or a flexible display.

18. The multilayer stack according to claim 16, wherein the optoelectronic device is a photodetector device that is an infrared, visible, or ultraviolet detector, a night vision device, or a focal plane array device.

19. The multilayer stack according to claim 1, wherein the multilayer stack further comprises a plurality of active layers and at least one additional tetradymite buffer layer deposited above the first active layer, wherein the plurality of active layers and the at least one additional buffer layer are arranged in any sequence.

20. The multilayer stack according to claim 1, wherein a ratio between the second interatomic periodic spacing and the first interatomic periodic spacing is between about 0.98 and about 1.02.

21. A method of fabricating a multilayer stack comprising:
a. depositing a tetradymite buffer layer onto a substrate comprising an amorphous, non-crystalline, or polycrystalline material, wherein the tetradymite buffer layer comprises a tetradymite compound with a first lattice structure with a first lattice spacing defined by a first interatomic periodic spacing, the tetradymite compound being:
a ternary tetradymite compound selected from the group consisting of $Bi_{2-x}Sb_xTe_3$, wherein x is 1 or values between 0 and 1, $Bi_2Te_2Se$, $Bi_2Te_2S$, $Bi_2Se_2S$, $Sb_2Te_2Se$, $Sb_2Te_2S$, $Bi_2Se_2Te$, $Bi_2Te_{1.5}S_{1.5}$, $Bi_2Te_{1.6}S_{1.4}$, $Sb_{1.68}Bi_{0.32}Te_3$, alloys therefore, and combinations thereof,
a quaternary tetradymite compound selected from the group consisting of $(Bi_{1-x}Sb_x)_2(Te_{1-y}Se_y)_3$, $(Bi_{1-x}Sb_x)_2(Te_{1-y}S_y)_3$, $(Bi_{1-x}Sb_x)_2(S_{1-y}Se_y)_3$, wherein x and y are values between 0 and 1, alloys thereof, and combinations thereof, or
combinations of the ternary and the quaternary tetradymite compounds;
b. depositing a first layer of an active material having a second lattice structure with a second lattice spacing defined by a second interatomic periodic spacing on the tetradymite buffer layer, wherein the first interatomic period spacing of the first lattice structure is varied, matched or tuned with respect to the second interatomic periodic spacing of the second lattice structure; and
c. validating the quality of the multilayer stack with an electron beam, an ion beam, or an electromagnetic beam selected from the group consisting of an x-ray beam, a visible light beam, an infrared light beam, a terahertz light beam, and an ultraviolet light beam, or by optical measurements.

22. The method according to claim 21, wherein the depositing a tetradymite buffer layer onto the substrate comprises coating at least one surface of the substrate with a tetradymite compound.

23. The method according to claim 21, wherein the active material is a semiconductor of the $A_xB_{1-x}C_yD_{1-y}$ type, where x and y are 0, 1 or values between 0 and 1, the elements A and B are individually selected from the group consisting of Cd, Zn, Hg, Mg, Be, Pb, Sn, Ge, and Si, and the elements C and D are individually selected from the group consisting of Te, Se and S.

24. The method according to claim 21, wherein the active material is a semiconductor of the $A_xB_{1-x}C_yD_{1-y}$ type, where x and y are 0, 1 or values between 0 and 1, the elements A and B are individually selected from the group consisting of B, Al, Ga and In, and the elements C and D are individually selected from the group consisting of N, P, As and Sb.

25. The method according to claim 21, wherein the active material is a semiconductor selected from the group consisting of $Cu_2ZnSnSe_4$, $Cu_2ZnSnS_4$, $CuInSe_2$, $CuInS_2$, $CuIn_xGa_{1-x}Se_2$, and $ZnSnN_2$, wherein x is equal to or less than 1.

26. The multilayer stack according to claim 21, wherein the active material is a hybrid between Si, Ge, Pb, Sn, and C and a semiconductor of the $A_xB_{1-x}C_yD_{1-y}$ type, where x and y are 0, 1 or values between 0 and 1, the elements A and B are individually selected from the group consisting of Cd, Zn, Hg, Mg, Be, and the elements C and D are individually selected from the group consisting of Te, Se and S.

27. The method according to claim 21, wherein depositing the buffer layer comprising coating at least one surface of the substrate with the buffer layer by vapor phase growth, chemical vapor deposition, liquid phase epitaxy, organic vapor deposition, molecular beam epitaxy (MBE), plasma discharge coating, sputtering, electron beam evaporation, metallorganic chemical vapor deposition (MOCVD), vacuum evaporation, spray coating, spray coating with post deposition annealing, electrodeposition, close space sublimation, vapor jet printing, or atomic layer deposition.

28. The method according to claim 21, wherein depositing the first layer of the active material on the buffer layer comprises depositing the first layer of the active material on the buffer layer by vapor phase growth, chemical vapor deposition, liquid phase epitaxy, vapor jet printing, organic vapor deposition, molecular beam epitaxy (MBE), plasma discharge coating, sputtering, electron beam evaporation, metallorganic chemical vapor deposition (MOCVD), vacuum evaporation, spray coating, spray coating with post deposition annealing, electrodeposition, close space sublimation, or atomic layer deposition.

29. The method according to claim 21, further comprising pre-coating the substrate with an inorganic or organic material.

30. The method according to claim 21, further comprising thermal annealing at least the tetradymite buffer layer before, during, or after depositing the first layer of an active material.

31. The method according to claim 21, wherein the depositing a tetradymite buffer layer on the substrate comprises depositing a tetradymite buffer layer with a thickness of from about 1 nm to about 1 µm on the substrate.

32. The method according to claim 21, wherein depositing the first layer of an active material on the tetradymite buffer layer comprises depositing a plurality of layers of active materials on the buffer layer.

33. The method according to claim 21, wherein validating comprises measuring optoelectronic qualities of the multilayer stack by optical measurements during or after depositing the tetradymite buffer layer and a layer of active material on the buffer layer.

34. The method according to claim 33, wherein the optical measurements comprise fluorescence, reflectivity, absorption, or combinations thereof.

35. The method according to claim 21, wherein validating comprises measuring a property of the multilayer stack and optionally adjusting the multilayer stack to improve the property.

36. The method according to claim 35, wherein the property of the multilayer stack is selected from the group consisting of buffer layer thickness, active layer thickness, buffer layer planarity, active layer planarity, crystalline orientation, crystallographic texture, bandgap, defect densities, charge carrier generation rates from electromagnetic beam exposure, charge carrier lifetimes, charge carrier mobilities, charge carrier radiative recombination, and combinations thereof.

37. The method according to claim 21, wherein the electromagnetic beam is an x-ray, electron-beam, visible light beam, infrared light beam, or ultraviolet light beam.

38. The method according to claim 21, further comprising depositing additional layers of active materials on the first layer of an active material.

39. The method according to claim 38, further comprising depositing at least one additional tetradymite buffer layer between two additional layers of active materials.

40. The method according to claim 21, further comprising depositing at least one additional tetradymite buffer layer on the tetradymite buffer layer.

41. The multilayer stack according to claim 1, wherein the buffer layer comprises a tetradymite compound gradient comprising at least one of the ternary tetradymite compound and the quaternary tetradymite compound, and a binary tetradymite compound selected from the group consisting of $Bi_2Te_3$, $Sb_2Te_3$, $Bi_2Se_3$, alloys thereof, and combinations thereof.

42. The multilayer stack according to claim 1, wherein the buffer layer comprises a plurality of buffer layers, at least one of the plurality of buffer layers of which comprises the tetradymite compound.

43. The multilayer stack according to claim 42, wherein at least one of the plurality of buffer layers comprises a binary tetradymite compound selected from the group consisting of $Bi_2Te_3$, $Sb_2Te_3$, $Bi_2Se_3$, alloys thereof, and combinations thereof.

44. The multilayer stack according to claim 1, wherein the buffer layer comprises a dopant include electron donating or accepting elements from group I to group VII, transition metals, rare earth elements, organo-metallic complexes containing transition metals, combinations or compounds thereof.

* * * * *